United States Patent
Sharifidehsari et al.

(10) Patent No.: US 11,296,292 B2
(45) Date of Patent: Apr. 5, 2022

(54) ORGANIC ELECTROLUMINESCENT DEVICE EMITTING GREEN LIGHT

(71) Applicant: CYNORA GMBH, Bruchsal (DE)

(72) Inventors: Hamed Sharifidehsari, Mannheim (DE); Georgios Liaptsis, Mannheim (DE); Jaime Leganes Carballo, Heidelberg (DE); Damien Joly, Beinheim (FR); Sajjad Hoseinkhani, Weihgaerten (DE)

(73) Assignee: CYNORA GMBH, Bruchsal (DE)

( * ) Notice: Subject to any disclaimer, the term of this patent is extended or adjusted under 35 U.S.C. 154(b) by 136 days.

(21) Appl. No.: 16/848,971

(22) Filed: Apr. 15, 2020

(65) Prior Publication Data
US 2021/0328166 A1 Oct. 21, 2021

(51) Int. Cl.
*H01L 51/50* (2006.01)

(52) U.S. Cl.
CPC ...... *H01L 51/5004* (2013.01); *H01L 51/5016* (2013.01); *H01L 2251/552* (2013.01)

(58) Field of Classification Search
CPC ............ H01L 51/5004; H01L 51/5016; H01L 2251/552
See application file for complete search history.

(56) References Cited

U.S. PATENT DOCUMENTS

| | | | |
|---|---|---|---|
| 2014/0077172 A1* | 3/2014 | So | H01L 51/5016 257/40 |
| 2016/0079547 A1* | 3/2016 | Park | C07F 7/0812 257/40 |
| 2019/0237694 A1 | 8/2019 | Thompson et al. | |
| 2019/0341571 A1* | 11/2019 | Liaptsis | H01L 51/5016 |
| 2019/0378982 A1 | 12/2019 | He et al. | |
| 2021/0083218 A1 | 3/2021 | Umeda et al. | |

FOREIGN PATENT DOCUMENTS

| WO | 2019/128633 A1 | 7/2019 |
|---|---|---|
| WO | 2019/186717 A1 | 10/2019 |

OTHER PUBLICATIONS

Liang et al, Angew. Chem. Int. Ed., 2018, 57:11316-11320.
Zhang et al., Angew. Chem. Int. Ed., 2019, 58:16912-16917.

* cited by examiner

*Primary Examiner* — Julio J Maldonado
*Assistant Examiner* — Mohammad A Rahman
(74) *Attorney, Agent, or Firm* — J.A. Lindeman & Co. PLLC

(57) ABSTRACT

The present invention relates to organic electroluminescent devices comprising a light-emitting layer B comprising a host material, a phosphorescence material and a emitter material, which exhibits a narrow—expressed by a small full width at half maximum (FWHM)—green emission at an emission maximum of 500 to 560 nm. Further, the present invention relates to a method for generating green light by means of an organic electroluminescent device according to the present invention.

13 Claims, No Drawings

ORGANIC ELECTROLUMINESCENT DEVICE EMITTING GREEN LIGHT

The present invention relates to organic electroluminescent devices comprising a light-emitting layer B comprising a host material, a phosphorescence material and an emitter material, which exhibits a narrow—expressed by a small full width at half maximum (FWHM)—green emission at an emission maximum of 500 to 560 nm. Further, the present invention relates to a method for generating green light by means of an organic electroluminescent device according to the present invention.

DESCRIPTION

Organic electroluminescent devices containing one or more light-emitting layers based on organics such as, e.g., organic light emitting diodes (OLEDs), light emitting electrochemical cells (LECs) and light-emitting transistors gain increasing importance. In particular, OLEDs are promising devices for electronic products such as e.g. screens, displays and illumination devices. In contrast to most electroluminescent devices essentially based on inorganics, organic electroluminescent devices based on organics are often rather flexible and producible in particularly thin layers. The OLED-based screens and displays already available today bear either good efficiencies and long lifetimes or good color purity and long lifetimes, but do not combine all three properties, i.e. good efficiency, long lifetime, and good color purity.

The color purity or color point of an OLED is typically provided by CIEx and CIEy coordinates, whereas the color gamut for next display generation is provided by so-called BT-2020 and DCPI3 values. Generally, in order to achieve these color coordinates, top emitting devices are needed to adjust the color coordinate by changing the cavity. In order to achieve high efficiency in top emitting devices while targeting these color gamut, a narrow emission spectrum in bottom emitting devices is needed.

State-of-the-art phosphorescence emitters exhibit a rather broad emission, which is reflected in a broad emission of phosphorescence-based OLEDs (PHOLEDs) with a full-width-half-maximum (FWHM) of the emission spectrum, which is larger than 0.25 eV. The broad emission spectrum of PHOLEDs in bottom devices, leads to high losses in out-coupling efficiency for top emitting device structure while targeting BT-2020 and DCPI3 color gamut.

Recently, some fluorescence or thermally-activated-delayed-fluorescence (TADF) emitters have been developed that display a rather narrow emission spectrum, which exhibit a FWHM of the emission spectrum, which is smaller than or equal to 0.25 eV, and therefore more suitable to achieve BT-2020 and DCPI3 color gamut. However, such fluorescence and TADF emitters typically suffer from low efficiency due to decreasing efficiencies at higher luminance (i.e. the roll-off behaviour of an OLED) as well as low lifetimes due to the exciton-polaron annihilation or exciton-exciton annihilation.

Surprisingly, it has been found that an organic electroluminescent device's light-emitting layer comprising a host material, a phosphorescence material and an emitter material, which exhibits a narrow—expressed by a small full width at half maximum (FWHM)—green emission, provides an organic electroluminescent device having good lifetime and quantum yields and exhibiting green emission. Herein, the main emission of the device occurs from the small FWHM emitter material. Such a device, yields a green emission with small FWHM and thus CIEx and CIEy color coordinates, which are close to the specifications defined by DCPI3 and BT2020.

Accordingly, one aspect of the present invention relates an organic electroluminescent device comprising a light-emitting layer B comprising:

(i) a host material $H^P$, which has a lowermost excited singlet state energy level $S1^P$ and a lowermost excited triplet state energy level $T1^P$, a highest occupied molecular orbital HOMO($H^P$) having an energy $E^{HOMO}(H^P)$ and a lowest unoccupied molecular orbital LUMO($H^P$) having an energy $E^{LUMO}(H^P)$;

(ii) a phosphorescence material $E^B$, which has a lowermost excited singlet state energy level $S1^E$ and a lowermost excited triplet state energy level $T1^E$, a highest occupied molecular orbital HOMO($E^E$) having an energy $E^{HOMO}(E^E)$ and a lowest unoccupied molecular orbital LUMO($E^E$) having an energy $E^{LUMO}(E^E)$; and (iii) a small full width at half maximum (FWHM) emitter $S^B$ which has a lowermost excited singlet state energy level $S1^S$ and a lowermost excited triplet state energy level $T1^S$, a highest occupied molecular orbital HOMO($E^S$) having an energy $E^{HOMO}(E^S)$ and a lowest unoccupied molecular orbital LUMO($E^S$) having an energy $E^{LUMO}(E^S)$, wherein $E^B$ transfers energy to $S^B$ and $S^B$ emits light with an emission maximum between 500 nm to 560 nm, and wherein the relations expressed by the following formulas (1) to (4) apply:

$$T1^E > S1^S \quad (1)$$

$$T1^P > T1^S \quad (2)$$

$$T1^P > T1^E \quad (3)$$

$$T1^P > S1^E \quad (4).$$

According to the invention, the lowermost excited triplet state of the phosphorescence material $E^B$ is higher in energy than the lowermost excited singlet state of the small full width at half maximum emitter $S^B$. The lowermost excited triplet state of the host material $H^P$ is higher in energy than the lowermost excited triplet state of the small full width at half maximum emitter $S^B$. The lowermost excited triplet state of the host material $H^P$ is higher in energy than the lowermost excited triplet state of the phosphorescence material $E^B$. The lowermost excited triplet state of the host material $H^P$ is higher in energy than the lowermost excited singlet state of the phosphorescence material $E^B$.

In one embodiment, the small FWHM emitter $S^B$ is characterized in that it has an emission spectrum, which exhibits a full width at half maximum (FWHM) of less than or equal to 0.25 eV (i.e., ≤0.25 eV).

In one embodiment, an emission spectrum with a full width at half maximum (FWHM) of less than or equal to 0.25 eV is observed for the fluorescent emitters and thermally activated delayed fluorescence emitters.

In one embodiment, an emission spectrum with a full width at half maximum (FWHM) of less than or equal to 0.25 eV is not observed for the phosphorescence emitters.

In one embodiment of the present invention, the small FWHM emitter $S^B$ is characterized in that it has an emission spectrum, which exhibits a full width at half maximum (FWHM), which is smaller than the FWHM of the emission spectrum of the phosphorescence material $E^B$: FWHM($S^B$) <FWHM($E^B$).

In one preferred embodiment, the organic electroluminescent device exhibits an emission maximum $\lambda^{max}(D)$ of 500 nm to 560 nm.

In one preferred embodiment, the organic electroluminescent device exhibits an emission maximum $\lambda^{max}(D)$ of 510 nm to 550 nm.

In one preferred embodiment, the small FWHM emitter $S^B$ emits light with an emission maximum between 510 nm to 550 nm.

In a preferred embodiment, the light-emitting layer B of the organic electroluminescent device additionally comprises a host material $H^N$, which has a lowermost excited singlet state energy level $S1^N$, a lowermost excited triplet state energy level $T1^N$, a highest occupied molecular orbital HOMO($H^N$) having an energy $E^{HOMO}(H^N)$ and a lowest unoccupied molecular orbital LUMO($H^N$) having an energy $E^{LUMO}(H^N)$;

wherein the relations expressed by the following formulas (2N), (3N), and (4N) apply:

$$T1^N > T1^S \tag{2N}$$

$$T1^N > T1^E \tag{3N}$$

$$T1^N > S1^E \tag{4N},$$

and wherein the relations expressed by the following formulas (5) to (11) apply:

$$E^{LUMO}(H^P) > E^{LUMO}(S^B) \tag{5}$$

$$E^{LUMO}(H^P) > E^{LUMO}(E^B) \tag{6}$$

$$E^{HOMO}(H^P) < E^{HOMO}(S^B) \tag{7}$$

$$E^{HOMO}(H^P) < E^{HOMO}(E^B) \tag{8}$$

$$E^{LUMO}(H^N) < E^{LUMO}(S^B) \tag{9}$$

$$E^{LUMO}(H^N) < E^{LUMO}(E^B) \tag{10}$$

$$E^{HOMO}(H^N) < E^{HOMO}(S^B) \tag{11}$$

$$E^{HOMO}(H^N) < E^{HOMO}(E^B) \tag{12}$$

According to the invention, the lowermost excited triplet state of the host material $H^N$ is higher in energy than the lowermost excited triplet state of the small full width at half maximum emitter $S^B$. The lowermost excited triplet state of the host material $H^N$ is higher in energy than the lowermost excited triplet state of the phosphorescence material $E^B$. The lowermost excited triplet state of the host material $H^N$ is higher in energy than the lowermost excited singlet state of the phosphorescence material $E^B$.

Additionally, the lowest unoccupied molecular orbital (LUMO) of the host material $H^P$ is higher in energy than the lowest unoccupied molecular orbital (LUMO) of the small full width at half maximum emitter $S^B$. The lowest unoccupied molecular orbital (LUMO) of the host material $H^P$ is higher in energy than the lowest unoccupied molecular orbital (LUMO) of the phosphorescence material $E^B$.

The highest occupied molecular orbital (HOMO) of the host material $H^P$ is lower in energy than the highest occupied molecular orbital (HOMO) of the small full width at half maximum emitter $S^B$. The highest occupied molecular orbital (HOMO) of the host material $H^P$ is lower in energy than the highest occupied molecular orbital (HOMO) of the phosphorescence material $E^B$.

Additionally, the lowest unoccupied molecular orbital (LUMO) of the host material $H^N$ is lower in energy than the lowest unoccupied molecular orbital (LUMO) of the small full width at half maximum emitter $S^B$. The lowest unoccupied molecular orbital (LUMO) of the host material $H^N$ is lower in energy than the lowest unoccupied molecular orbital (LUMO) of the phosphorescence material $E^B$.

The highest occupied molecular orbital (HOMO) of the host material $H^N$ is lower in energy than the highest occupied molecular orbital (HOMO) of the small full width at half maximum emitter $S^B$. The highest occupied molecular orbital (HOMO) of the host material $H^N$ is lower in energy than the highest occupied molecular orbital (HOMO) of the phosphorescence material $E^B$.

In one embodiment, the relations expressed by formula (1E) and at least one of (2E) and (3E) apply:

$$E^{LUMO}(H^N) - E^{HOMO}(H^P) > T1^E \tag{1E}$$

$$E^{LUMO}(H^P) - E^{LUMO}(H^N) \geq 0.2 \text{ eV} \tag{2E}$$

$$E^{HOMO}(H^P) - E^{HOMO}(H^N) \geq 0.2 \text{ eV} \tag{3E}.$$

The energy difference between the lowest unoccupied molecular orbital (LUMO) of the host material $H^N$ and the highest occupied molecular orbital (HOMO) of the host material $H^P$ is larger than the energy of the lowermost excited triplet state of the phosphorescence material $E^B$.

The highest occupied molecular orbital (HOMO) of the host material $H^P$ is at least 0.20 eV higher in energy than the HOMO of the host material $H^N$, i.e. the $E^{HOMO}(H^P)$ is less negative than $E^{HOMO}(H^N)$ by at least 0.20 eV. The energy difference between the LUMO of $H^N$ and the HOMO of $H^P$ must be larger than the difference between the HOMO of $H^N$ and the HOMO of $H^P$ ($E^{LUMO}(H^N) - E^{HOMO}(H^P) > E^{HOMO}(H^P) - E^{HOMO}(H^N)$). In a preferred embodiment, the HOMO of the host material $H^P$ is more than 0.20 eV, more preferred more than 0.25 eV or even more preferably more than 0.30 eV higher in energy than the HOMO of the host material $H^N$. Typically, the HOMO of the host material $H^P$ is less than 4.0 eV, more preferred less than 3.0 eV, even more preferably less than 2.0 eV or even less than 1.0 eV higher in energy than the HOMO of the host material $H^N$.

Alternatively the lowest unoccupied molecular orbital (LUMO) of the host material $H^P$ is at least 0.20 eV higher in energy than the LUMO of the host material $H^N$, i.e. the $E^{LUMO}(H^P)$ is less negative than $E^{LUMO}(H^N)$ by at least 0.20 eV. The energy difference between the LUMO of $H^N$ and the HOMO of $H^P$ must be larger than the difference between the LUMO of $H^N$ and the LUMO of $H^P$ ($E^{LUMO}(H^N) - E^{HOMO}(H^P) > E^{LUMO}(H^P) - E^{LUMO}(H^N)$). In a preferred embodiment, the LUMO of the host material $H^P$ is more than 0.20 eV, more preferred more than 0.25 eV or even more preferably more than 0.30 eV higher in energy than the LUMO of the host material $H^N$. Typically, the LUMO of the host material $H^P$ is less than 4.0 eV, more preferred less than 3.0 eV, even more preferably less than 2.0 eV or even less than 1.0 eV higher in energy than the LUMO of the host material $H^N$.

Surprisingly it was found, that the main contribution to the emission band of the optoelectronic device according to the invention can be attributed to the emission of $S^B$ indicating a sufficient transfer of energy transfer from $E^B$ to $S^B$ and from the host materials $H^P$ and $H^N$ to $E^B$ and/or $S^B$.

In one embodiment, the highest occupied molecular orbital (HOMO) of the host material $H^P$ is at least 0.20 eV higher in energy than the HOMO of the host material $H^N$ and the lowest unoccupied molecular orbital (LUMO) of the host material $H^P$ is at least 0.20 eV higher in energy than the LUMO of the host material $H^N$. In a preferred embodiment, the HOMO of the host material $H^P$ is more than 0.20 eV, more preferred more than 0.25 eV or even more preferably more than 0.30 eV higher in energy than the HOMO of the host material $H^N$ and the LUMO of the host material $H^P$ is more than 0.20 eV, more preferred more than 0.25 eV or even more preferably more than 0.30 eV higher in energy than the LUMO of the host material $H^N$.

In one embodiment, $H^P$ and $H^N$ form an exciplex. The person skilled in the art knows how to choose pairs of $H^P$ and $H^N$, which form an exciplex and the selection criteria—in addition to the HOMO- and/or LUMO-energy level requirements described above—such as a low steric shielding of $H^P$ and $H^N$.

In one embodiment, $H^P$ is selected from the group consisting of the following or a mixture of two or more thereof:

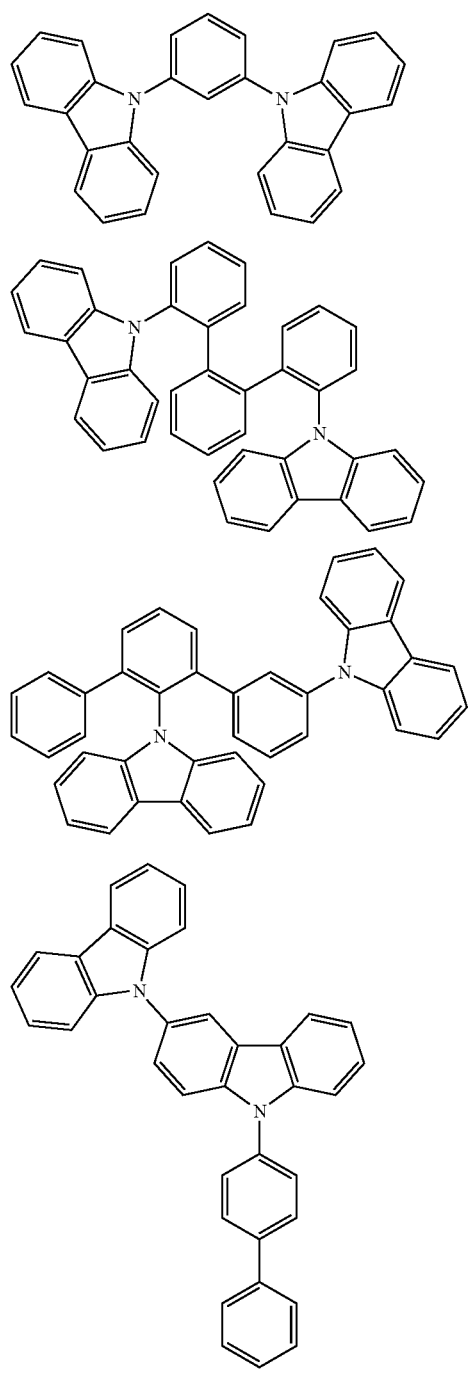

-continued

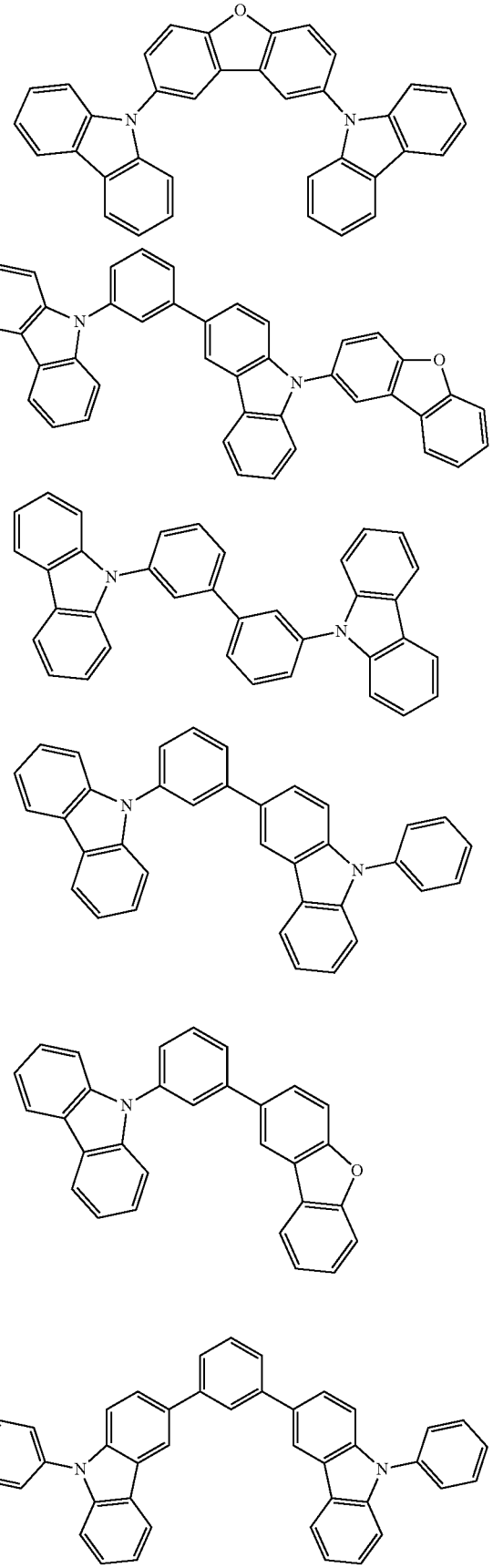

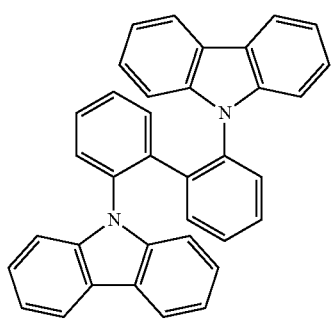
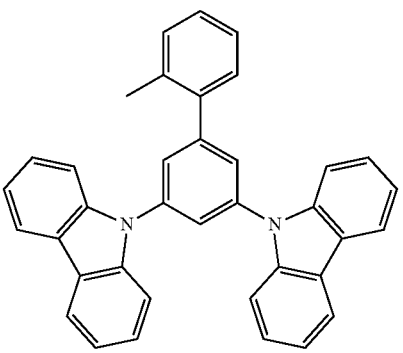
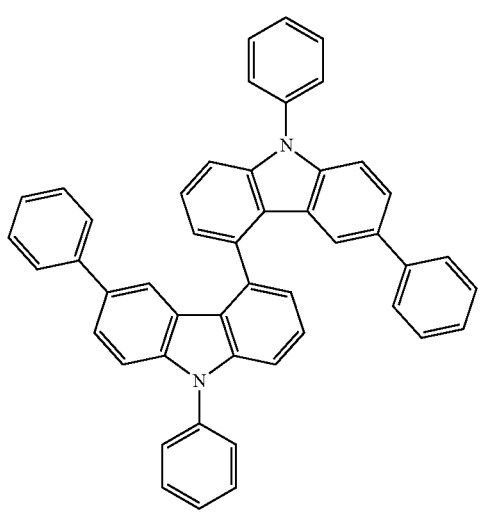
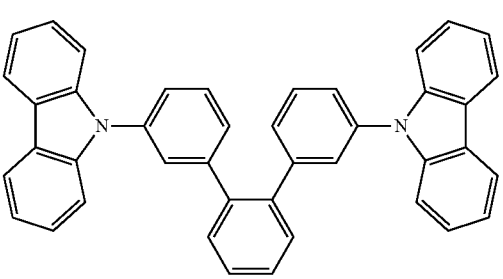
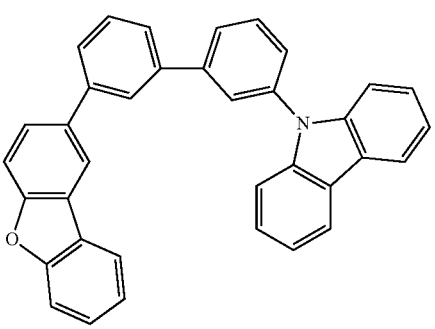
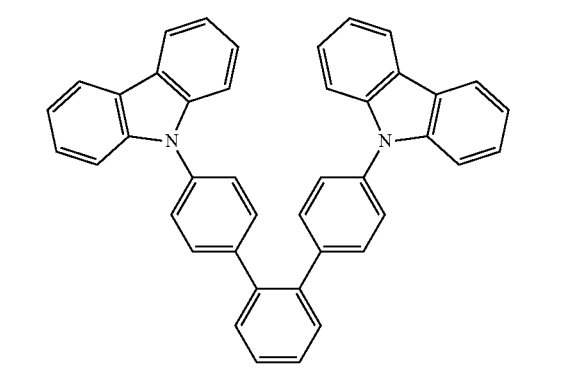
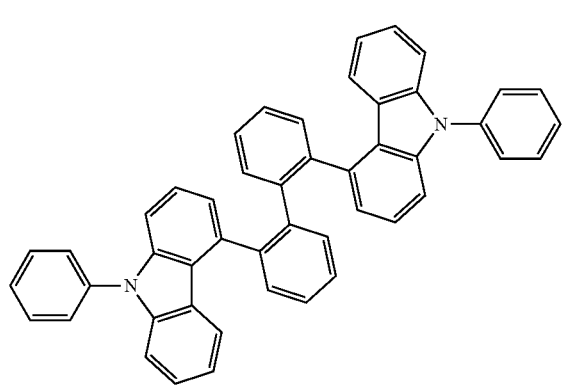
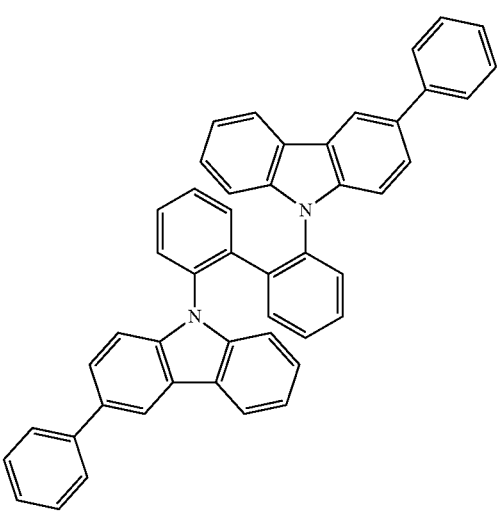

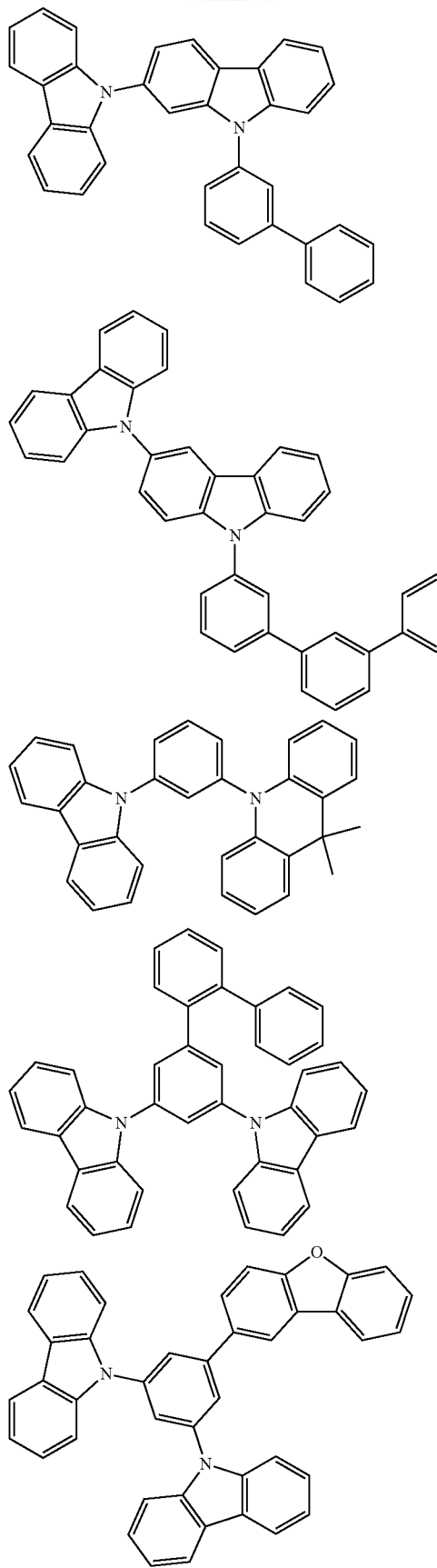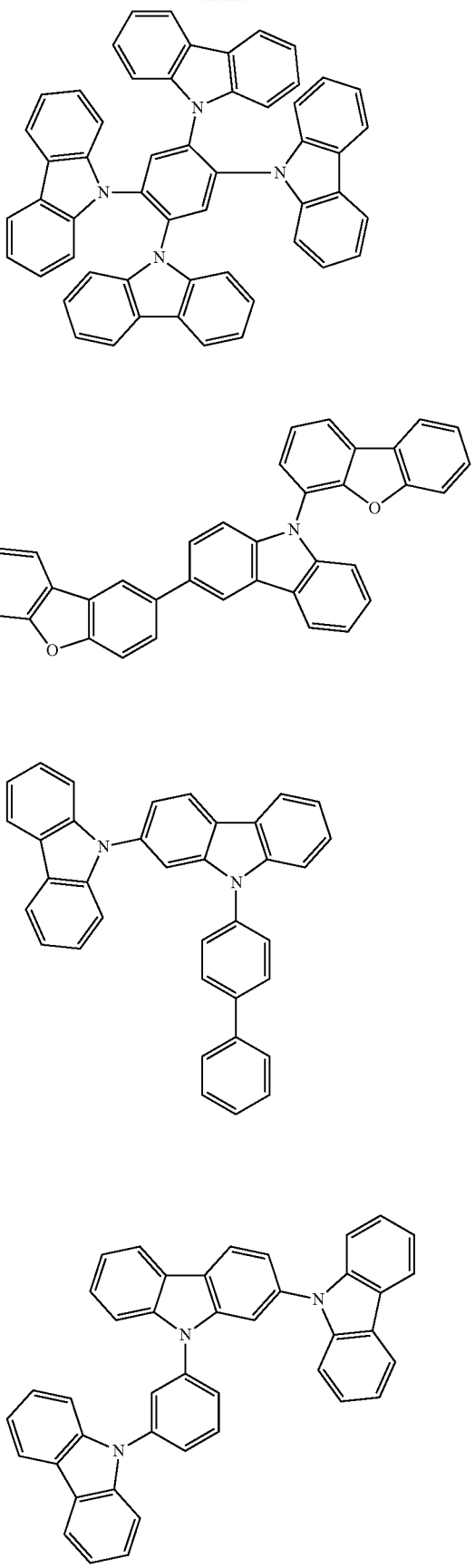

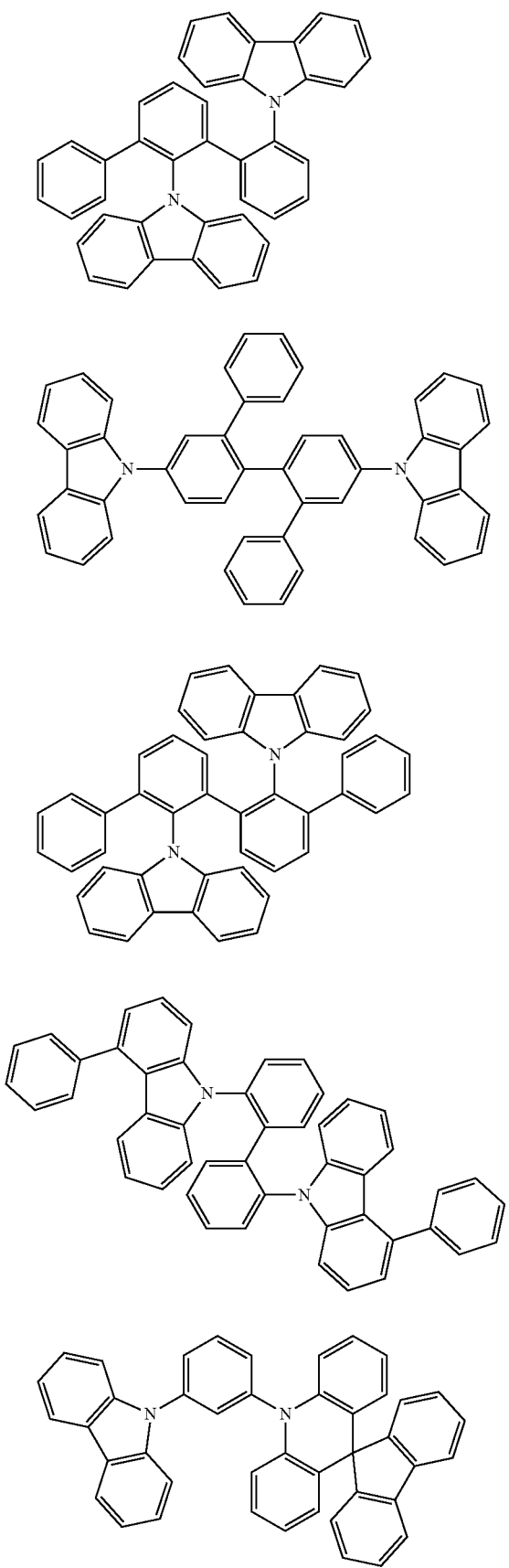
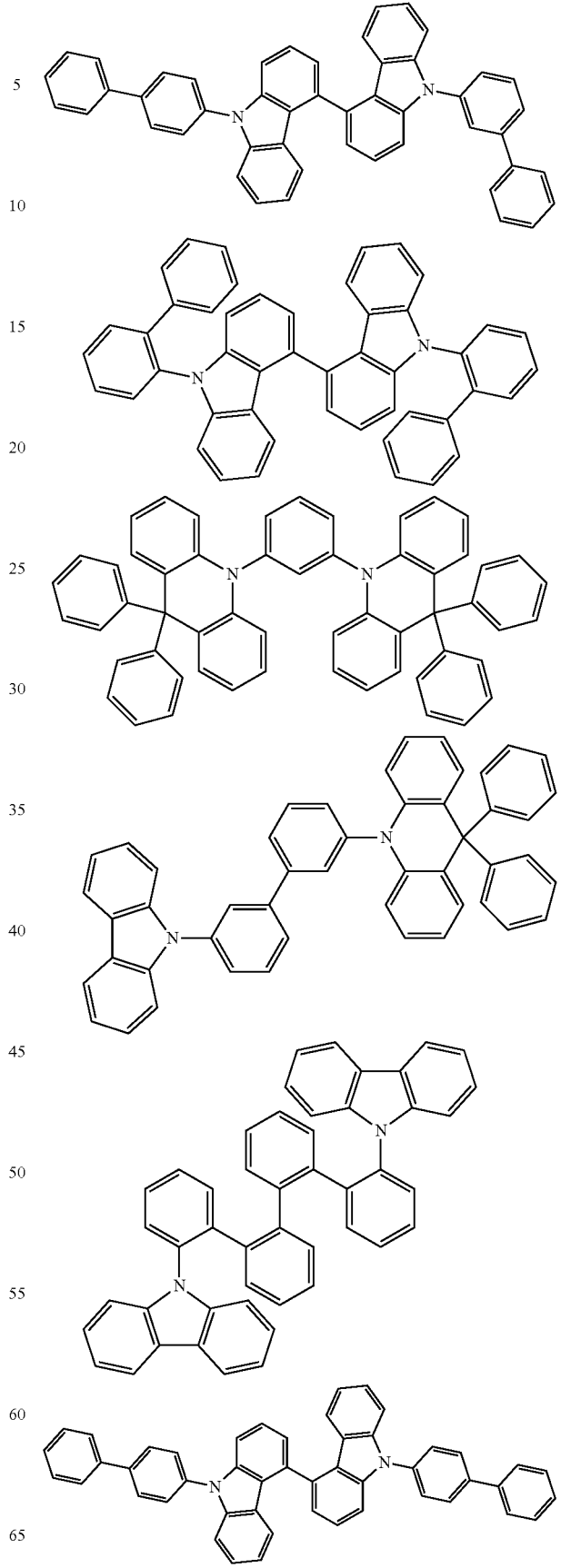

-continued
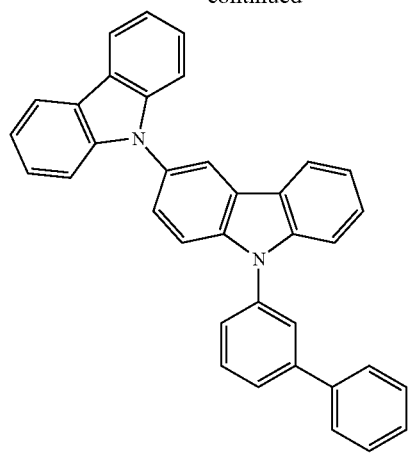
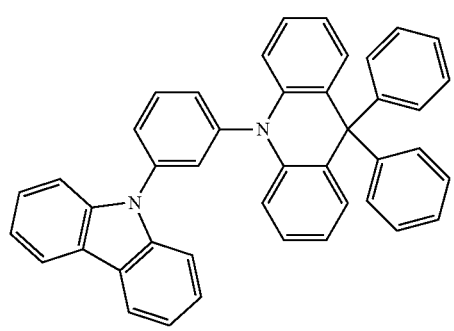
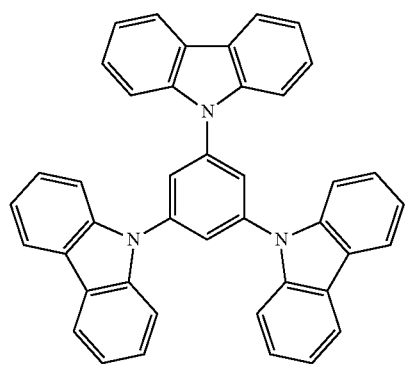
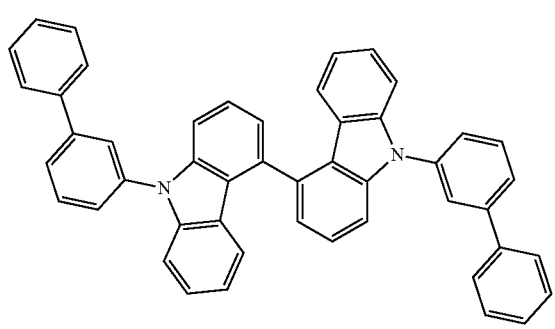
In one embodiment, $H^N$ is selected from the group consisting of the following or a mixture of two or more thereof:
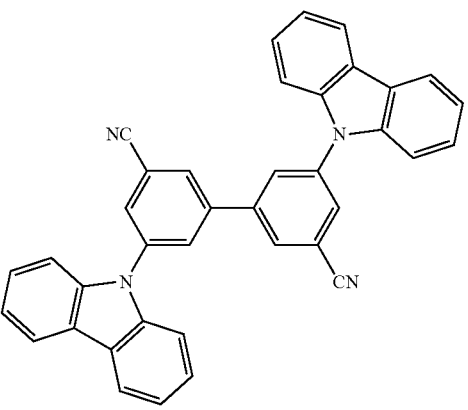
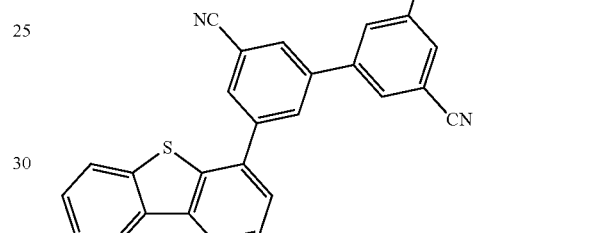
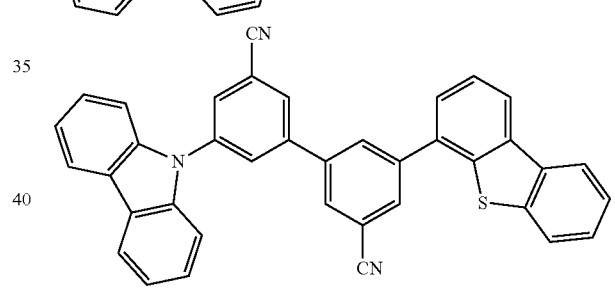
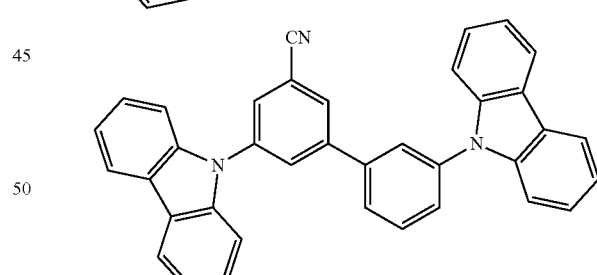
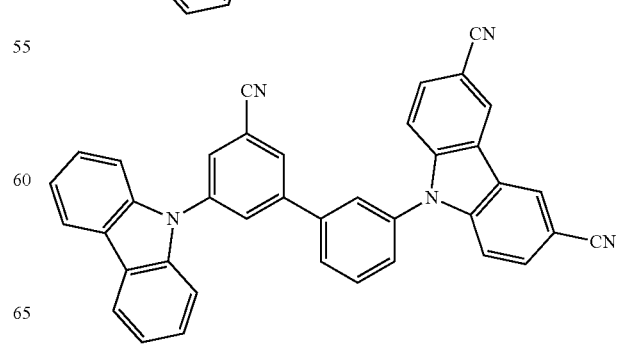

-continued

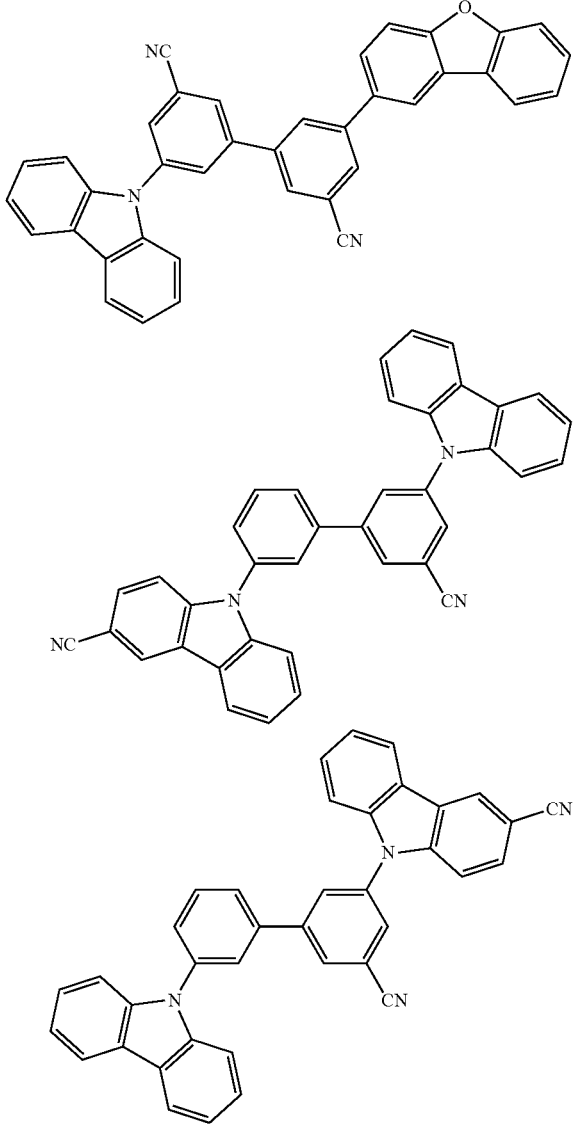

In one embodiment, $H^P$ and $H^N$ form an exciplex; $H^P$ and $S^B$ do not form an exciplex; $H^N$ and $S^B$ do not form an exciplex and $E^B$ and $S^B$ do not form an exciplex.

In one embodiment, $H^P$ and $H^N$ form an exciplex; $H^P$ and $E^B$ do not form an exciplex; $H^N$ and $E^B$ do not form an exciplex; $H^P$ and $S^B$ do not form an exciplex; $H^N$ and $S^B$ do not form an exciplex and $E^B$ and $S^B$ do not form an exciplex. Exciplex formation of $H^P$ and $E^B$; $H^N$ and $E^B$; $H^P$ and $S^B$; $H^N$ and $S^B$; or $E^B$ and $S^B$.

In one embodiment, $H^N$ does not contain any phosphine oxide groups, in particular $H^N$ is not bis[2-(diphenylphosphino)phenyl] ether oxide (DPEPO).

As used herein, the terms organic electroluminescent device and opto-electronic light-emitting devices may be understood in the broadest sense as any device comprising a light-emitting layer B comprising a host material $H^P$, a phosphorescence material $E^B$ and a small FWHM emitter $S^B$.

The organic electroluminescent device may be understood in the broadest sense as any device based on organic materials that is suitable for emitting light in the visible or nearest ultraviolet (UV) range, i.e., in the range of a wavelength of from 380 to 800 nm. More preferably, organic electroluminescent device may be able to emit light in the visible range, i.e., of from 400 to 800 nm.

In a preferred embodiment, the organic electroluminescent device is a device selected from the group consisting of an organic light emitting diode (OLED), a light emitting electrochemical cell (LEC), and a light-emitting transistor.

Particularly preferably, the organic electroluminescent device is an organic light emitting diode (OLED). Optionally, the organic electroluminescent device as a whole may be intransparent, semi-transparent or (essentially) transparent.

The term "layer" as used in the context of the present invention preferably is a body that bears an extensively planar geometry.

The light-emitting layer B preferably bears a thickness of not more than 1 mm, more preferably not more than 0.1 mm, even more preferably not more than 10 μm, even more preferably not more than 1 μm, in particular not more than 0.1 μm.

In a preferred embodiment, the small full width at half maximum (FWHM) emitter $S^B$ is an organic material. According to the invention, organic emitter or organic material means that the emitter or material (predominantly) consists of the elements hydrogen (H), carbon (C), nitrogen (N), boron (B), silicon (Si) and optionally fluorine (F), optionally bromine (Br) and optionally oxygen (O). Particularly preferably, it does not contain any transition metals.

In a preferred embodiment, the small full width at half maximum (FWHM) emitter $S^B$ is an organic TADF material. In a preferred embodiment, the small FWHM emitter $S^B$ is an organic emitter.

The compounds $H^P$ and $H^N$ and the emitters $E^B$ and $S^B$ may be comprised in the organic electroluminescent device in any amount and any ratio.

In a preferred embodiment, in the organic electroluminescent device of the present invention, the light-emitting layer B comprises more compound $H^P$ than emitter $E^B$, according to the weight.

In a preferred embodiment, in the organic electroluminescent device of the present invention, the light-emitting layer B comprises more compound $H^N$ than emitter $E^B$, according to the weight.

In a preferred embodiment, in the organic electroluminescent device of the present invention, the light-emitting layer B comprises more TADF material $E^B$ than emitter $S^B$, according to the weight.

In a preferred embodiment where $H^N$ is optional, in the organic electroluminescent device of the present invention, the light-emitting layer B comprises (or consists of):
(i) 10-84% by weight of the host compound $H^P$;
(ii) 0-84% by weight of the host compound $H^N$;
(iii) 5-15% by weight of the Phosphorescence material $E^B$; and
(iv) 1-10% by weight of the small FWHM emitter $S^B$; and optionally
(v) 0-72% by weight of one or more solvents.

In a preferred embodiment where $H^N$ is optional, in the organic electroluminescent device of the present invention, the light-emitting layer B comprises (or consists of):
(i) 22-70% by weight of the host compound $H^P$;
(ii) 0-70% by weight of the host compound $H^N$;
(iii) 5-10% by weight of the phosphorescence material $E^B$; and
(iv) 1-5% by weight of the emitter $S^B$; and optionally
(v) 0-72% by weight of one or more solvents.

In another preferred embodiment where $H^N$ is necessary, in the organic electroluminescent device of the present invention, the light-emitting layer B comprises (or consists of):

(i) 10-30% by weight of the host compound $H^P$;

(ii) 40-74% by weight of the host compound $H^N$;

(iii) 15-30% by weight of the Phosphorescence material $E^B$; and (iv) 1-5% by weight of the small FWHM emitter $S^B$; and optionally (v) 0-34% by weight of one or more solvents.

In another preferred embodiment where $H^N$ is present, in the organic electroluminescent device of the present invention, the light-emitting layer B comprises (or consists of):

(i) 40-74% by weight of the host compound $H^N$;

(ii) 10-30% by weight of the host compound $H^P$;

(iii) 15-30% by weight of the Phosphorescence material $E^B$; and (iv) 1-5% by weight of the small FWHM emitter $S^B$; and optionally (v) 0-34% by weight of one or more solvents.

In a preferred embodiment, the phosphorescence material $E^B$ exhibits an emission maximum (determined in poly (methyl methacrylate) (PMMA), $\lambda_{max}^{PMMA}(E^B)$) in the range from 500 to 540 nm. In a preferred embodiment, phosphorescence material $E^B$ exhibits an emission maximum $\lambda_{max}^{PMMA}(E^B)$ in the range from 490 to 530 nm.

Phosphorescent Materials

Phosphorescent material utilize the intramolecular spin-orbit interaction (heavy atom effect) caused by metal atoms to obtain light emission from triplets. Examples of such a phosphorescent materials include compounds represented by the following general formula E-I,

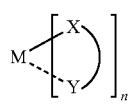

Formula E-I

In formula E-I, M is selected from the group consisting of Ir, Pt, Au, Eu, Ru, Re, Ag and Cu;

n is an integer of 1 to 3; and

X and Y are each independently a bidentate monoanionic ligand.

Examples of the compound represented by the formula E-I include compounds represented by the following general formula E-II or general formula E-III:

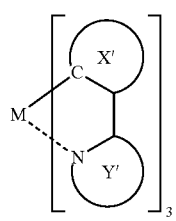

Formula E-II

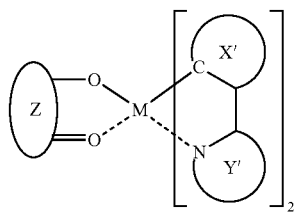

Formula E-III

In the formulas E-II and E-III, X' is an aromatic ring which is carbon(C)-bonded to M and Y' is a complex containing nitrogen(N) coordinated to M to form a ring.

X' and Y' are bonded, and X' and Y' may form a new ring. In formula E-III, Z is a bidentate ligand having two oxygens (O). In the formulas E-II and E-III, M is preferably Ir from the viewpoint of high efficiency and long lifetime.

In the formulas E-II and E-III, the aromatic ring X' may be, for example, a $C_6$-$C_{30}$-aryl, a $C_6$-$C_{16}$-aryl, even more preferably a $C_6$-$C_{12}$-aryl, and particularly preferably a $C_6$-$C_{10}$-aryl, wherein X' at each occurrence may be optionally substituted with one or more substituents $R^E$.

In the formulas E-II and E-III, Y' may be, for example, a $C_2$-$C_{30}$-heteroaryl, a $C_2$-$C_{25}$-heteroaryl, more preferably a $C_2$-$C_{20}$-heteroaryl, even more preferably a $C_2$-$C_{15}$-heteroaryl and particularly preferably a $C_2$-$C_{10}$-heteroaryl, wherein Y' at each occurrence may be optionally substituted with one or more substituents $R^E$. Furthermore, Y' may be, for example, a $C_1$-$C_5$-heteroaryl, which may be optionally substituted with one or more substituents $R^E$.

In the formulas E-II and E-III, the bidentate ligand having two oxygens(O) Z may be, for example, a $C_2$-$C_{30}$-bidentate ligand having two oxygens, a $C_2$-$C_{25}$-bidentate ligand having two oxygens, more preferably a $C_2$-$C_{20}$-bidentate ligand having two oxygens, even more preferably a $C_2$-$C_{15}$-bidentate ligand having two oxygens and particularly preferably a $C_2$-$C_{10}$-bidentate ligand having two oxygens, wherein Z at each occurrence may be optionally substituted with one or more substituents $R^E$. Furthermore, Z may be, for example, a $C_2$-$C_5$-bidentate ligand having two oxygens, which may be optionally substituted with one or more substituents $R^E$.

$R^E$ may be at each occurrence independently from another selected from the group consisting of hydrogen, deuterium, $N(R^{5E})_2$, $OR^{5E}$, $SR^{5E}$, $Si(R^{5E})_3$, $CF_3$, CN, halogen, $C_1$-$C_{40}$-alkyl which may be optionally substituted with one or more substituents $R^{5E}$ and wherein one or more non-adjacent $CH_2$-groups are optionally substituted by $R^{5E}C=CR^{5E}$, $C\equiv C$, $Si(R^{5E})_2$, $Ge(R^{5E})_2$, $Sn(R^{5E})_2$, $C=O$, $C=S$, $C=Se$, $C=NR^{5E}$, $P(=O)(R^{5E})$, SO, $SO_2$, $NR^{5E}$, O, S or $CONR^{5E}$;

$C_1$-$C_{40}$-thioalkoxy which may be optionally substituted with one or more substituents $R^{5E}$ and wherein one or more non-adjacent $CH_2$-groups are optionally substituted by $R^{5E}C=CR^{5E}$, $C\equiv C$, $Si(R^{5E})_2$, $Ge(R^{5E})_2$, $Sn(R^{5E})_2$, $C=O$, $C=S$, $C=Se$, $C=NR^{5E}$, $P(=O)(R^{5E})$, SO, $SO_2$, $NR^{5E}$, O, S or $CONR^{5E}$; and $C_6$-$C_{60}$-aryl which may be optionally substituted with one or more substituents $R^{5E}$; $C_3$-$C_{57}$-heteroaryl which may be optionally substituted with one or more substituents $R^{5E}$;

$R^{5E}$ may be at each occurrence independently from another selected from the group consisting of hydrogen, deuterium, $N(R^{6E})_2$, $OR^{6E}$, $SR^{6E}$, $Si(R^{6E})_3$, $CF_3$, CN, F, $C_1$-$C_{40}$-alkyl which may be optionally substituted with one or more substituents $R^{6E}$ and wherein one or more non-adjacent $CH_2$-groups are optionally substituted by $R^{6E}C=CR^{6E}$, C≡C, $Si(R^{6E})_2$, $Ge(R^{6E})_2$, $Sn(R^{6E})_2$, C=O, C=S, C=Se, $C=NR^{6E}$, $P(=O)(R^{6E})$, SO, $SO_2$, $NR^{6E}$, O, S or $CONR^{6E}$;

$C_6$-$C_{60}$-aryl which may be optionally substituted with one or more substituents $R^{6E}$; and $C_3$-$C_{57}$-heteroaryl which may be optionally substituted with one or more substituents $R^{6E}$;

$R^{6E}$ may be at each occurrence independently from another selected from the group consisting of hydrogen, deuterium, OPh, $CF_3$, CN, F, $C_1$-$C_5$-alkyl, wherein one or more hydrogen atoms are optionally, independently from each other substituted by deuterium, CN, $CF_3$, or F;

$C_1$-$C_5$-alkoxy, wherein one or more hydrogen atoms are optionally, independently from each other substituted by deuterium, CN, $CF_3$, or F;

$C_1$-$C_5$-thioalkoxy, wherein one or more hydrogen atoms are optionally, independently from each other substituted by deuterium, CN, $CF_3$, or F;

$C_6$-$C_{18}$-aryl which may be optionally substituted with one or more $C_1$-$C_5$-alkyl substituents;

$C_3$-$C_{17}$-heteroaryl which may be optionally substituted with one or more $C_1$-$C_5$-alkyl substituents;

$N(C_6$-$C_{18}$-aryl$)_2$;

$N(C_3$-$C_{17}$-heteroaryl$)_2$, and $N(C_3$-$C_{17}$-heteroaryl$)(C_6$-$C_{18}$-aryl).

The substituents $R^E$, $R^{5E}$, or $R^{6E}$ independently from each other optionally may optionally form a mono- or polycyclic, aliphatic, aromatic, heteroaromatic and/or benzo-fused ring system with one or more substituents $R^E$, $R^{5E}$, $R^{6E}$, and/or with X', Y' and Z.

Examples of the compound represented by formula E-II include $Ir(ppy)_3$, $Ir(ppy)_2(acac)$, $Ir(mppy)_3$, $Ir(PPy)_2(m$-bppy), and $BtpIr(acac)$, $Ir(btp)_2(acac)$, $Ir(2$-$phq)_3$, Hex-Ir$(phq)_3$, $Ir(fbi)_2(acac)$, fac-Tris(2-(3-p-xylyl)phenyl)pyridine iridium(III), $Eu(dbm)_3(Phen)$, $Ir(piq)_3$, $Ir(piq)_2(acac)$, $Ir(Fiq)_2(acac)$, $Ir(Flq)_2(acac)$, $Ru(dtb$-$bpy)_3.2(PF6)$, $Ir(2$-$phq)_3$, $Ir(BT)_2(acac)$, $Ir(DMP)_3$, $Ir(Mpq)_3$, $Ir(phq)_2tpy$, fac-$Ir(ppy)_2Pc$, $Ir(dp)PQ_2$, $Ir(Dpm)(Piq)_2$, Hex-Ir$(piq)_2(acac)$, Hex-Ir$(piq)_3$, $Ir(dmpq)_3$, $Ir(dmpq)_2(acac)$, FPQIrpic and the like.

Other examples of the compound represented by the formula E-II include compounds represented by the following formulas E-II-1 to E-II-11. In the structural formula, "Me" represents a methyl group.

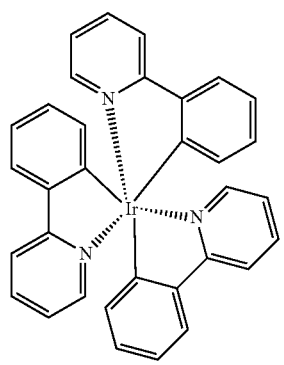

E-II-1

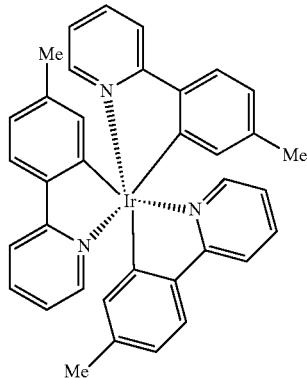

E-II-2

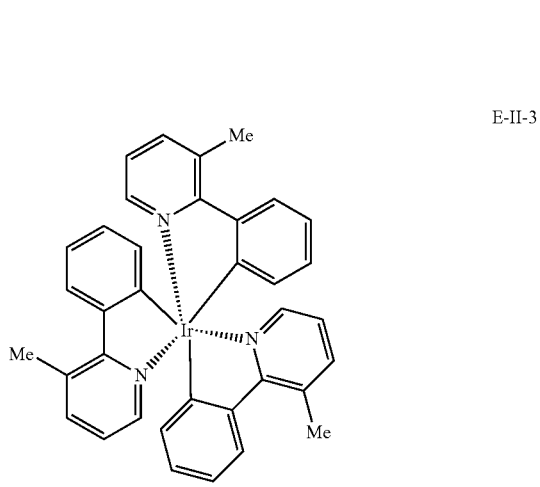

E-II-3

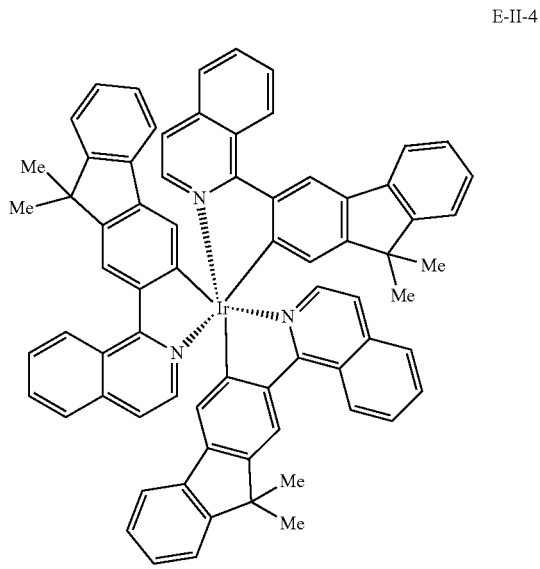

E-II-4

E-II-5
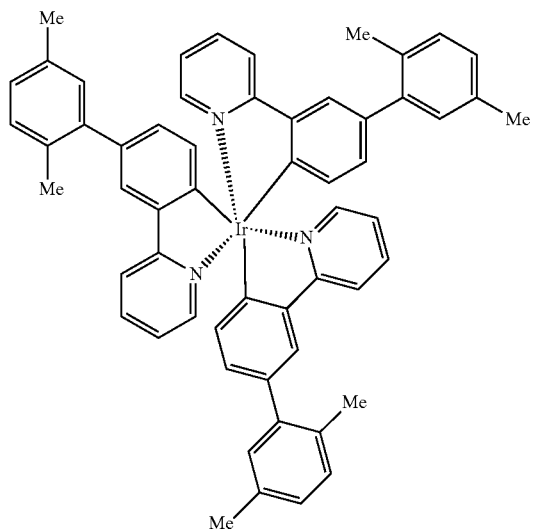
E-II-6
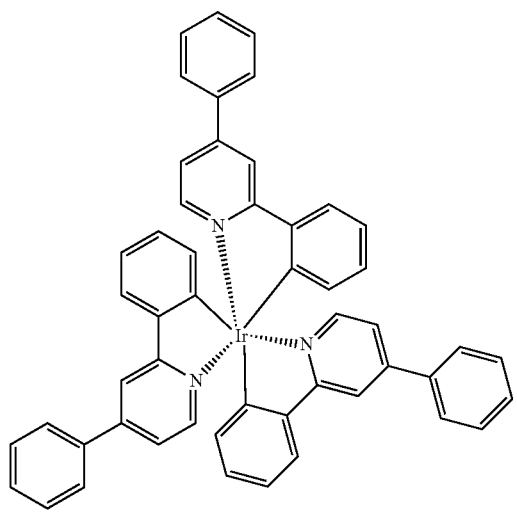
E-II-7
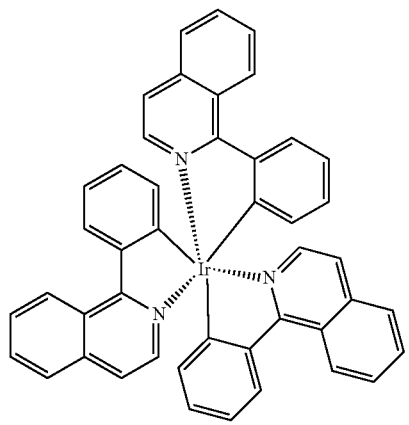
E-II-8
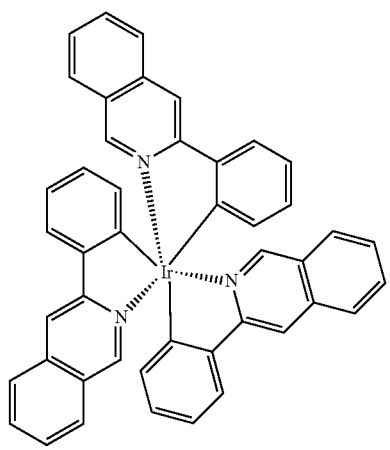
E-II-9
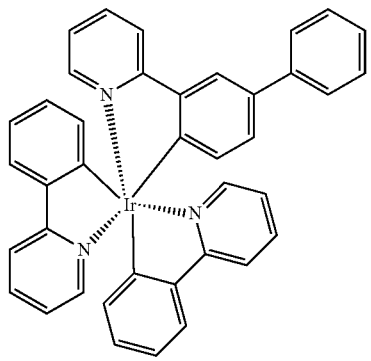
E-II-10
E-II-11
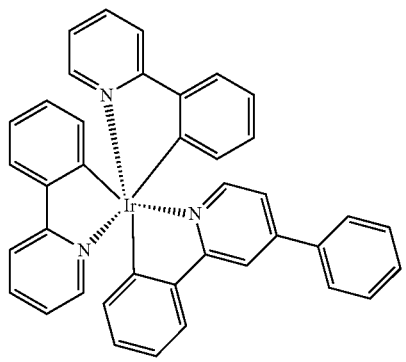

Other examples of the compound represented by the formula E-III include compounds represented by the following formulas E-III-1 to E-III-6. In the structural formula, "Me" represents a methyl group.

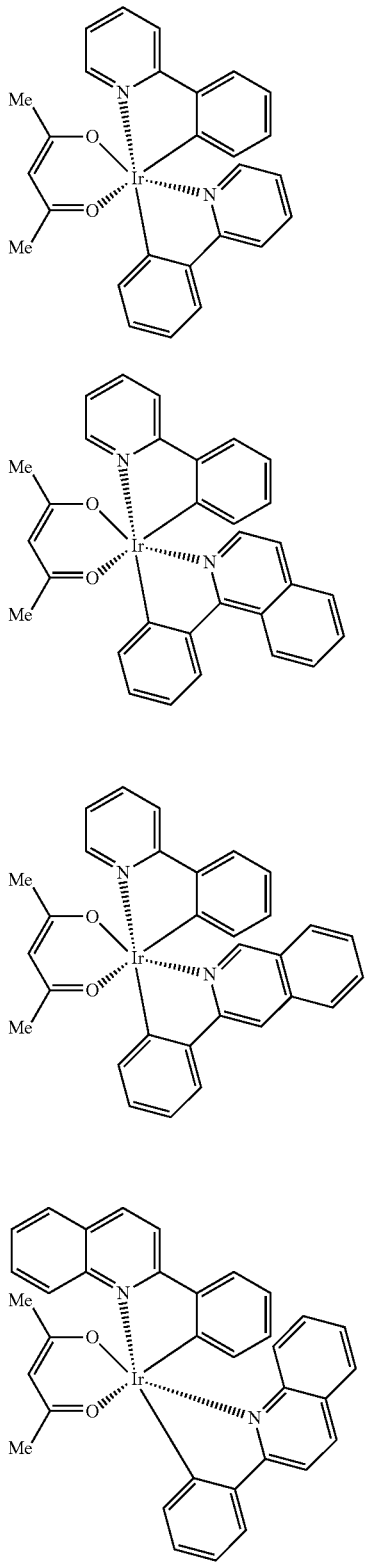

E-III-1

E-III-2

E-III-3

E-III-4

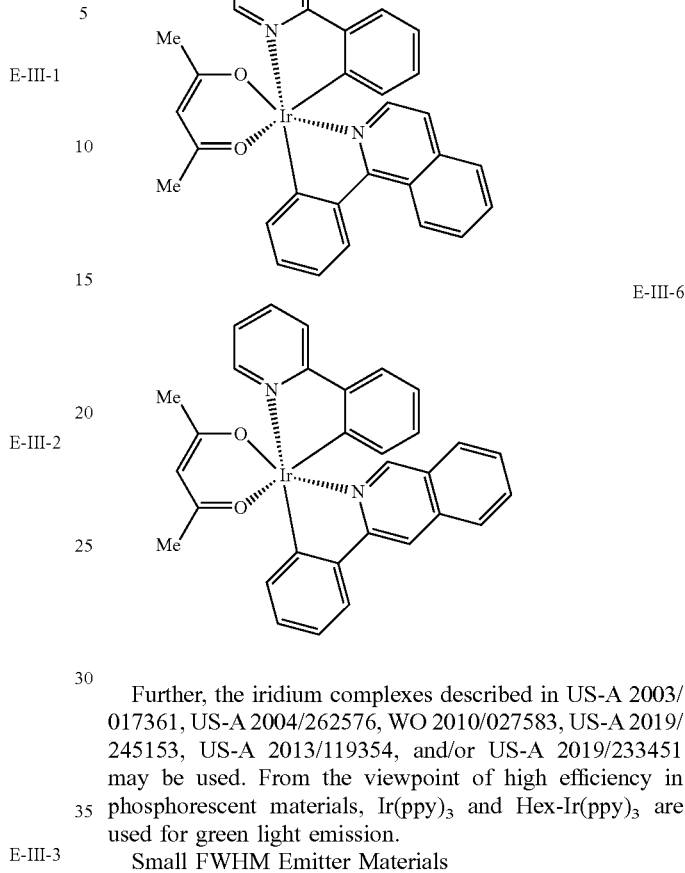

E-III-5

E-III-6

Further, the iridium complexes described in US-A 2003/017361, US-A 2004/262576, WO 2010/027583, US-A 2019/245153, US-A 2013/119354, and/or US-A 2019/233451 may be used. From the viewpoint of high efficiency in phosphorescent materials, Ir(ppy)$_3$ and Hex-Ir(ppy)$_3$ are used for green light emission.

Small FWHM Emitter Materials

Preferably, the small FWHM emitter $S^B$ is characterized in that it has an emission spectrum, which exhibits a full width at half maximum (FWHM) of less than or equal to 0.25 eV (i.e., ≤0.25 eV).

Preferably, the small FWHM emitter $S^B$ is chosen to exhibit an emission with a full width at half maximum (FWHM) below 0.25 eV, preferably less than 0.20 eV, even more preferably less than 0.15 eV in PMMA.

In one embodiment of the invention, the small FWHM emitter $S^B$ is selected from the group consisting of a fluorescent emitter and a thermally activated delayed fluorescence emitter.

As used herein, the terms "fluorescent material" and "fluorescent emitter" may be understood interchangeably.

According to the present invention, a fluorescent material is characterized in that it exhibits a $\Delta E_{ST}$ value, which corresponds to the energy difference between the lowermost excited singlet state (S1) and the lowermost excited triplet state (T1), of more than 0.4 eV.

As used herein, the terms "TADF material" and "TADF emitter" may be understood interchangeably.

According to the present invention, a TADF material is characterized in that it exhibits a $\Delta E_{ST}$ value, which corresponds to the energy difference between the lowermost excited singlet state (S1) and the lowermost excited triplet state (T1), of less than 0.4 eV, preferably less than 0.3 eV, more preferably less than 0.2 eV, even more preferably less than 0.1 eV or even less than 0.05 eV.

According to the present invention, a material which exhibits a $\Delta E_{ST}$ value, which corresponds to the energy difference between the lowermost excited singlet state (S1) and the lowermost excited triplet state (T1), of 0.4 eV is characterized as TADF material.

In one embodiment of the invention, the small FWHM emitter $S^B$ is an organic green fluorescence emitter.

Device Wherein the Small FWHM Emitter $S^B$ is a Boron (B)-Containing Emitter

In one embodiment, the small FWHM emitter $S^B$ is a green boron containing emitter.

Examples of green boron containing small FWHM emitter $S^B$ contain compounds represented by the following general formula B-I

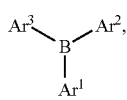

Formula B-I wherein B is boron, $Ar^1, Ar^2, Ar^3$ is at each occurrence independently selected from the group consisting of an aromatic ring, and an heteroaromatic ring, and $Ar^1, Ar^2, Ar^3$ might optionally be linked to each other to form a ring.

The aromatic ring as $Ar^1, Ar^2, Ar^3$ of the general formula B-I may be, for example, an aryl ring having 6 to 30 carbon atoms, and the aryl ring may preferably be an aryl ring having 6 to 16 carbon atoms, more preferably an aryl ring having 6 to 12 carbon atoms, and particularly preferably an aryl ring having 6 to 10 carbon atoms.

Specific examples of the aromatic ring as $Ar^1, Ar^2, Ar^3$ of the general formula B-I include a benzene ring which may be a monocyclic system; a biphenyl ring which may be a bicyclic system; a naphthalene ring which may be a fused bicyclic system, a terphenyl ring (m-terphenyl, o-terphenyl, or p-terphenyl) which may be a tricyclic system; an acenaphthylene ring, a fluorene ring, a phenalene ring and a phenanthrene ring, which are fused tricyclic systems; a triphenylene ring, a pyrene ring and a naphthacene ring, which are fused tetracyclic systems; and a perylene ring and a pentacene ring, which are fused pentacyclic systems.

The heteroaromatic ring as $Ar^1, Ar^2, Ar^3$ of the general formula B-I may be, for example, a heteroaryl ring having 2 to 30 carbon atoms, and the heteroaryl ring may preferably be a heteroaryl ring having 2 to 25 carbon atoms, more preferably a heteroaryl ring having 2 to 20 carbon atoms, even more preferably a heteroaryl ring having 2 to 15 carbon atoms, and particularly preferably a heteroaryl ring having 2 to 10 carbon atoms. Furthermore, the heteroaromatic ring as $Ar^1, Ar^2, Ar^3$ of the general formula B-I may be, for example, a heterocyclic ring containing 1 to 5 heteroatoms selected from oxygen, sulfur and nitrogen in addition to carbon as the ring-constituting atoms.

Examples of the heteroaromatic ring as $Ar^1, Ar^2, Ar^3$ of the general formula B-I include a pyrrole ring, an oxazole ring, an isoxazole ring, a thiazole ring, an isothiazole ring, an imidazole ring, an oxadiazole ring, a thiadiazole ring, a triazole ring, a tetrazole ring, a pyrazole ring, a pyridine ring, a pyrimidine ring, a pyridazine ring, a pyrazine ring, a triazine ring, an indole ring, an isoindole ring, a 1H-indazole ring, a benzimidazole ring, a benzoxazole ring, a benzothiazole ring, a 1H-benzotriazole ring, a quinoline ring, an isoquinoline ring, a cinnoline ring, a quinazoline ring, a quinoxaline ring, a phthalazine ring, a naphthyridine ring, a purine ring, a pteridine ring, a carbazole ring, an acridine ring, a phenoxathiin ring, a phenoxazine ring, a phenothi-azine ring, a phenazine ring, an indolizine ring, a furan ring, a benzofuran ring, an isobenzofuran ring, a dibenzofuran ring, a thiophene ring, a benzothiophene ring, a dibenzothiophene ring, a furazane ring, an oxadiazole ring, and a thianthrene ring.

At least one hydrogen atom in the aforementioned aromatic or heteroaromatic ring as $Ar^1, Ar^2, Ar^3$ of the general formula B-I may be substituted one or more substituents $R^a$, wherein $R^a$ may be at each occurrence independently from another selected from the group consisting of hydrogen, deuterium, $N(R^5)_2$, $OR^5$, $SR^5$, $Si(R^5)_2$, $CF_3$, CN, halogen, $C_1$-$C_{40}$-alkyl which may be optionally substituted with one or more substituents $R^5$ and wherein one or more non-adjacent $CH_2$-groups are optionally substituted by $R^5C=CR^5$, $C\equiv C$, $Si(R^5)_2$, $Ge(R^5)_2$, $Sn(R^5)_2$, $C=O$, $C=S$, $C=Se$, $C=NR^5$, $P(=O)(R^5)$, SO, $SO_2$, $NR^5$, O, S or $CONR^5$;

$C_1$-$C_{40}$-thioalkoxy which may be optionally substituted with one or more substituents $R^5$ and wherein one or more non-adjacent $CH_2$-groups are optionally substituted by $R^5C=CR^5$, $C\equiv C$, $Si(R^5)_2$, $Ge(R^5)_2$, $Sn(R^5)_2$, $C=O$, $C=S$, $C=Se$, $C=NR^5$, $P(=O)(R^5)$, SO, $SO_2$, $NR^5$, O, S or $CONR^5$; and $C_6$-$C_{60}$-aryl which may be optionally substituted with one or more substituents $R^5$; $C_3$-$C_{57}$-heteroaryl which may be optionally substituted with one or more substituents $R^5$;

$R^5$ may be at each occurrence independently from another selected from the group consisting of hydrogen, deuterium, $N(R^6)_2$, $OR^6$, $SR^6$, $Si(R^6)_3$, $CF_3$, CN, F, $C_1$-$C_{40}$-alkyl which may be optionally substituted with one or more substituents $R^6$ and wherein one or more non-adjacent $CH_2$-groups are optionally substituted by $R^6C=CR^6$, $C\equiv C$, $Si(R^6)_2$, $Ge(R^6)_2$, $Sn(R^6)_2$, $C=O$, $C=S$, $C=Se$, $C=NR^6$, $P(=O)(R^6)$, SO, $SO_2$, $NR^6$, O, S or $CONR^6$;

$C_6$-$C_{60}$-aryl which may be optionally substituted with one or more substituents $R^6$; and $C_3$-$C_{57}$-heteroaryl which may be optionally substituted with one or more substituents $R^6$;

$R^6$ may be at each occurrence independently from another selected from the group consisting of hydrogen, deuterium, OPh, $CF_3$, CN, F, $C_1$-$C_5$-alkyl, wherein one or more hydrogen atoms are optionally, independently from each other substituted by deuterium, CN, $CF_3$, or F;

$C_1$-$C_5$-alkoxy, wherein one or more hydrogen atoms are optionally, independently from each other substituted by deuterium, CN, $CF_3$, or F;

$C_1$-$C_5$-thioalkoxy, wherein one or more hydrogen atoms are optionally, independently from each other substituted by deuterium, CN, $CF_3$, or F;

$C_6$-$C_{18}$-aryl which may be optionally substituted with one or more $C_1$-$C_5$-alkyl substituents;

$C_3$-$C_{17}$-heteroaryl which may be optionally substituted with one or more $C_1$-$C_5$-alkyl substituents;

$N(C_6$-$C_{18}$-aryl$)_2$;

$N(C_3$-$C_{17}$-heteroaryl$)_2$, and $N(C_3$-$C_{17}$-heteroaryl)($C_6$-$C_{18}$-aryl).

Examples of compounds represented formula B-I include compounds represented by the following general formula B-II, or general formula B-III, or general formula B-IV:

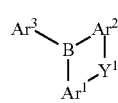

Formula B-II

-continued

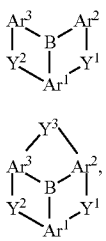

Formula B-III

Formula B-IV wherein $Y^1$, $Y^2$, $Y^3$, is at each occurrence independently selected from the group NR', O, C(R')$_2$, S or Si(R')$_2$; wherein each R' is independently from each other selected from the group consisting of:

$C_1$-$C_5$-alkyl, which is optionally substituted with one or more substituents $R^{6S}$;

$C_6$-$C_{60}$-aryl, which is optionally substituted with one or more substituents $R^{6S}$; and $C_3$-$C_{57}$-heteroaryl, which is optionally substituted with one or more substituents $R^{6S}$;

$R^{6S}$ is at each occurrence independently from another selected from the group consisting of hydrogen, deuterium, OPh, CF$_3$, CN, F, $C_1$-$C_5$-alkyl, wherein optionally one or more hydrogen atoms are independently from each other substituted by deuterium, CN, CF$_3$, or F;

$C_1$-$C_5$-alkoxy, wherein optionally one or more hydrogen atoms are independently from each other substituted by deuterium, CN, CF$_3$, or F;

$C_1$-$C_5$-thioalkoxy, wherein optionally one or more hydrogen atoms are independently from each other substituted by deuterium, CN, CF$_3$, or F;

$C_2$-$C_5$-alkenyl, wherein optionally one or more hydrogen atoms are independently from each other substituted by deuterium, CN, CF$_3$, or F;

$C_2$-$C_5$-alkynyl, wherein optionally one or more hydrogen atoms are independently from each other substituted by deuterium, CN, CF$_3$, or F; $C_6$-$C_{18}$-aryl, which is optionally substituted with one or more $C_1$-$C_5$-alkyl substituents;

$C_3$-$C_{17}$-heteroaryl, which is optionally substituted with one or more $C_1$-$C_5$-alkyl substituents;

N($C_6$-$C_{18}$-aryl)$_2$,

N($C_3$-$C_{17}$-heteroaryl)$_2$; and

N($C_3$-$C_{17}$-heteroaryl)($C_6$-$C_{18}$-aryl).

The substituents $R^a$, $R^5$, $R^6$, R' or $R^{6S}$ independently from each other optionally may form a mono- or polycyclic, aliphatic, aromatic, heteroaromatic and/or benzo-fused ring system with one or more substituents $R^a$, $R^5$, $R^6$, R' or $R^{6S}$ and/or the aromatic or heteroaromatic rings Ar$^1$, Ar$^2$, and Ar$^3$.

In one embodiment, the compounds represented by formula B-I include compounds represented by the formula B-III-1, formula B-III-2, formula B-III-3, formula B-IV-1, formula B-IV-2, and formula B-IV-3,

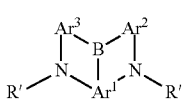

Formula B-III-1

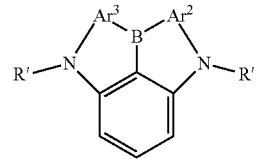

Formula B-III-2

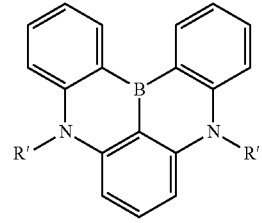

Formula B-III-3

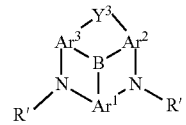

Formula B-IV-1

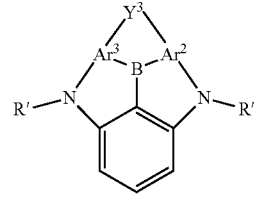

Formula B-IV-2

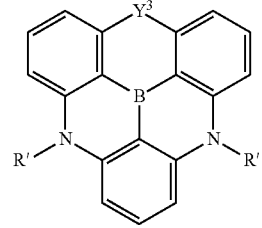

Formula B-IV-3 wherein the aforementioned structures are optionally substituted by one or several substituents, which optionally additionally rings.

In a preferred embodiment, the small FWHM emitter $S^B$ comprises or consists of a polycyclic aromatic compound.

In one embodiment of the invention, the small FWHM emitter $S^B$ is a near-range-charge-transfer (NRCT) emitter. According to the invention, a NRCT emitter shows a delayed component in the time-resolved photoluminescence spectrum and exhibits a near-range HOMO-LUMO separation as described by Hatakeyama et al. (Advanced Materials, 2016, 28(14):2777-2781, DOI: 10.1002/adma.201505491). In some embodiments, the NRCT emitter is a TADF material.

Examples of the compounds represented by the formula B-III-1 include structures containing:
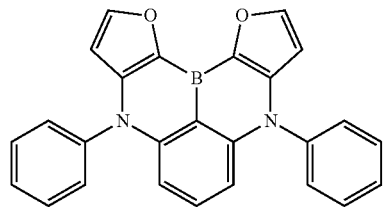
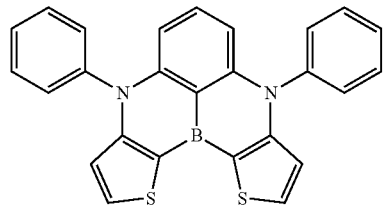
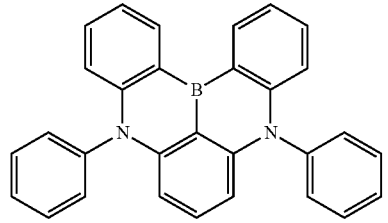
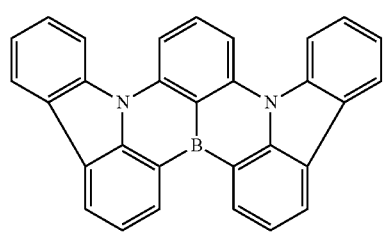
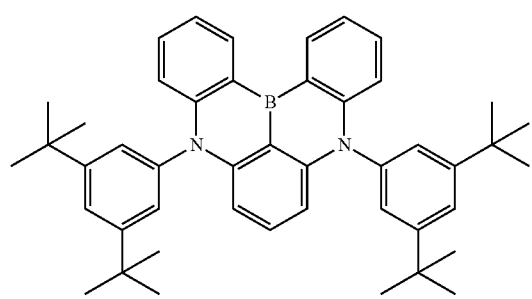
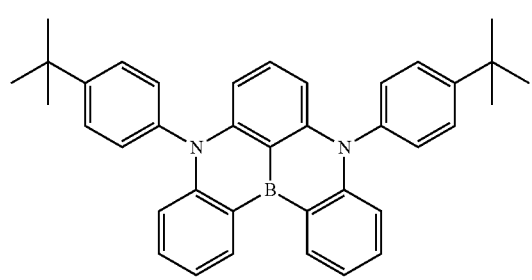
-continued
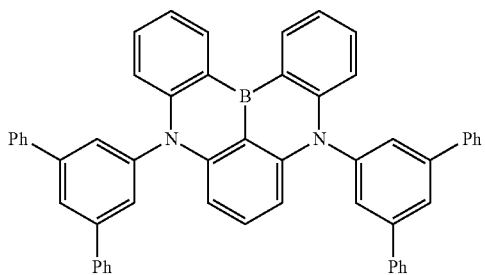
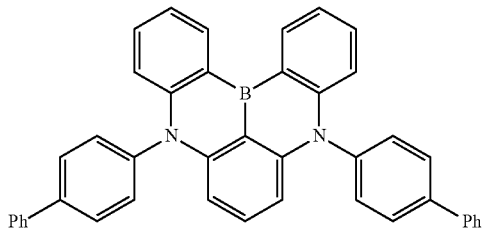
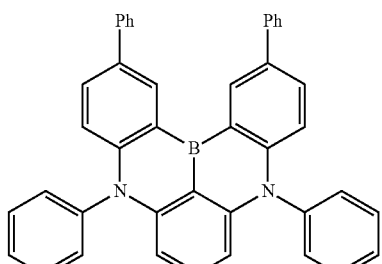
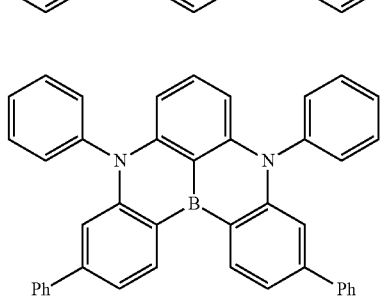
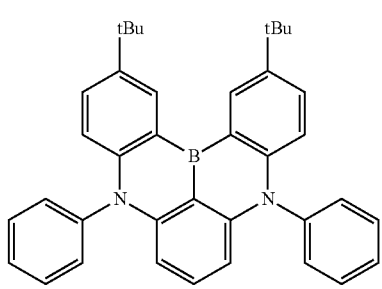
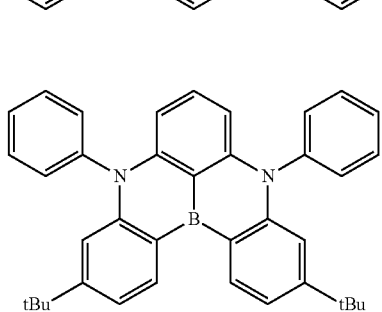

31
-continued
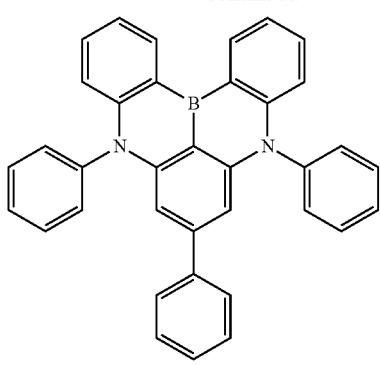
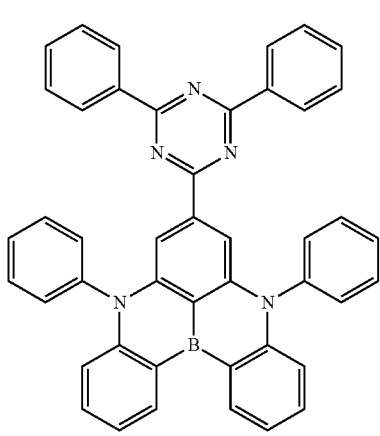
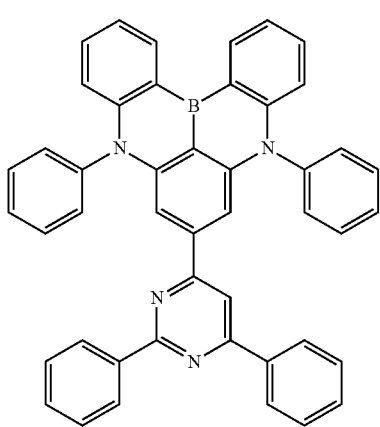
32
-continued
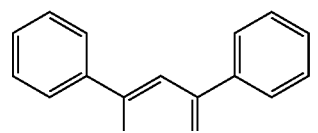
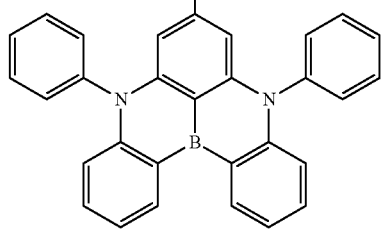
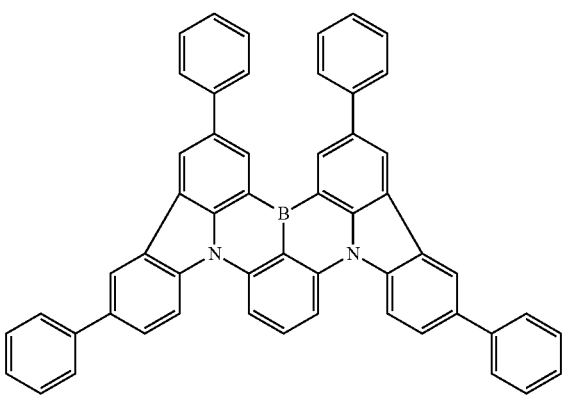
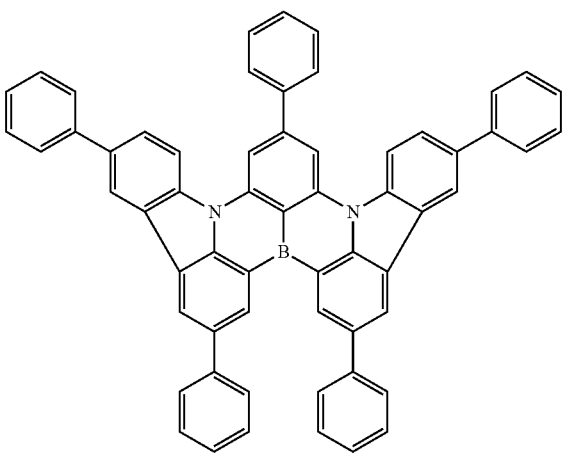

In a preferred embodiment, the small FWHM emitter $S^B$ is a green boron-containing NRCT emitter selected from the following group:
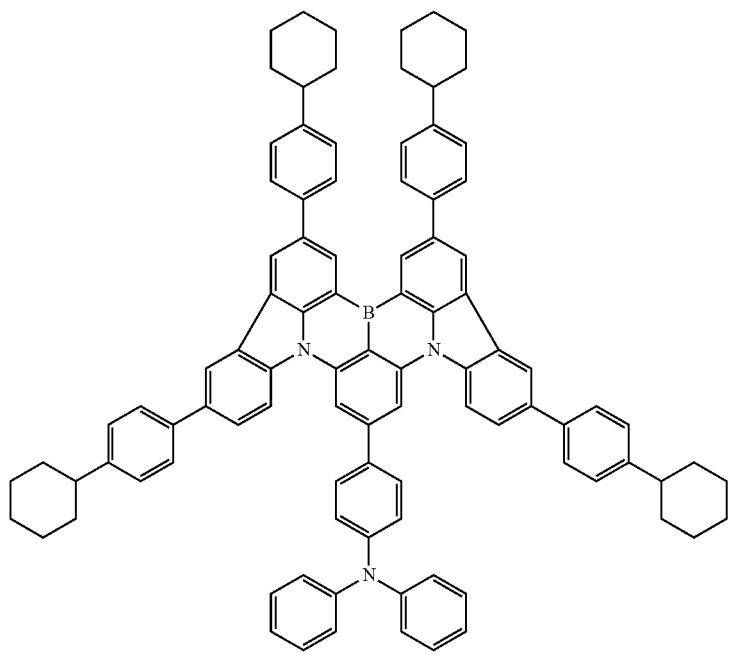
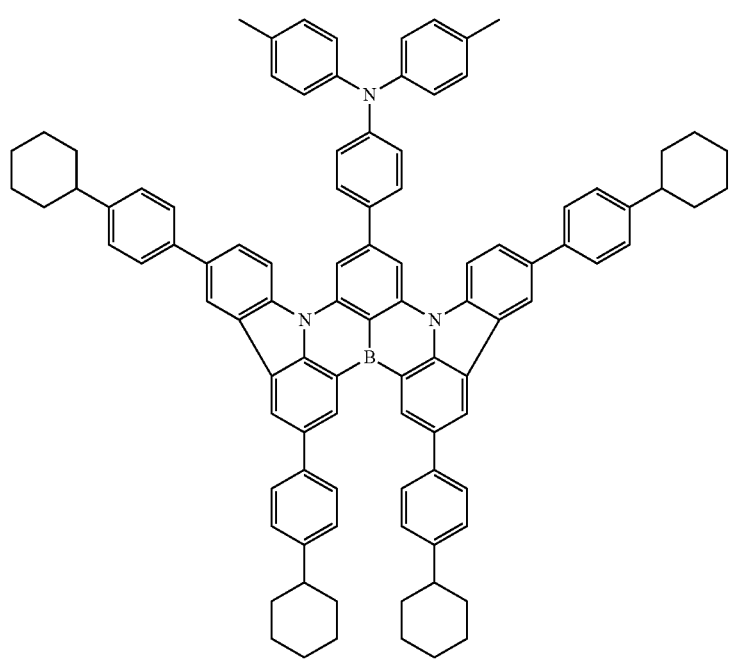

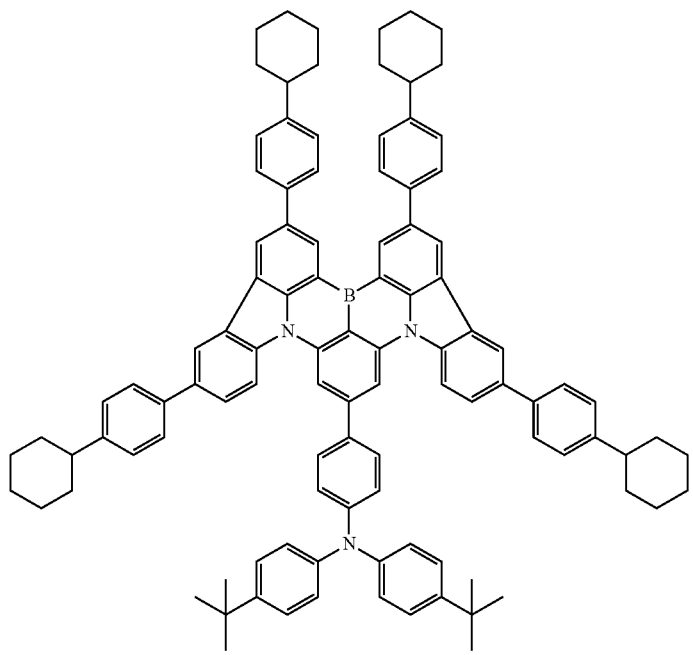
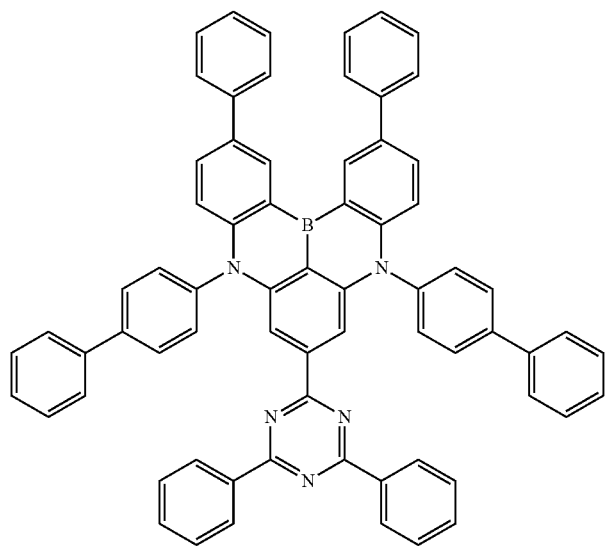

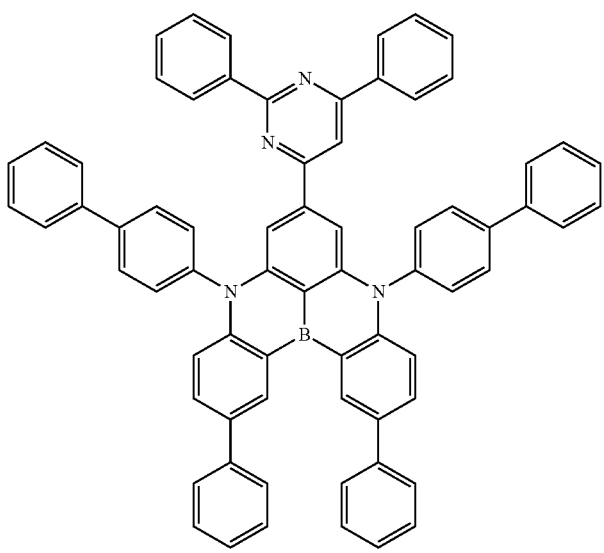

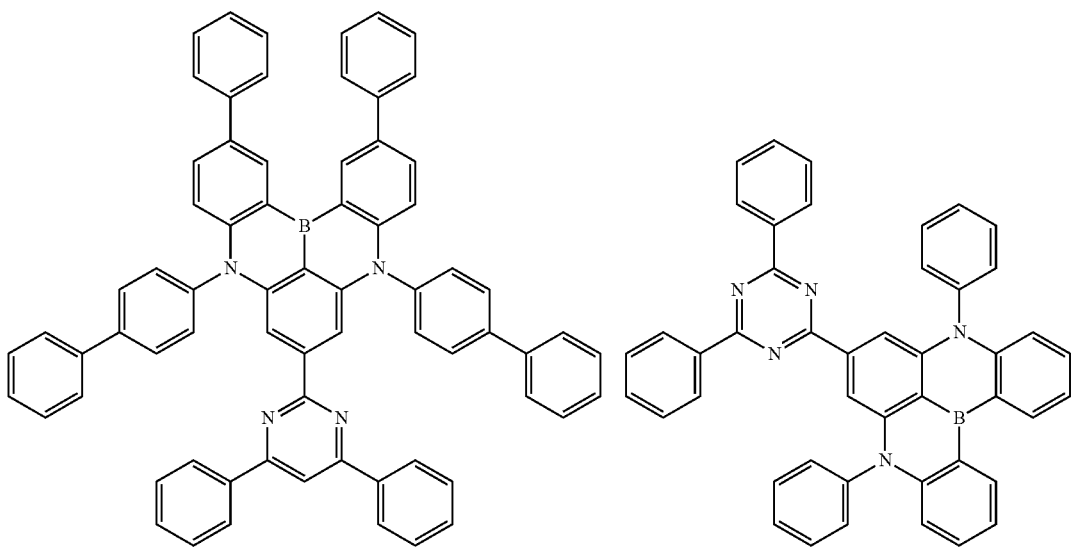

The person skilled in the art will notice that the light-emitting layer B will typically be incorporated in the organic electroluminescent device of the present invention. Preferably, such organic electroluminescent device comprises at least the following layers: at least one light-emitting layer B, at least one anode layer A and at least one cathode layer C.

Preferably, the anode layer A contains at least one component selected from the group consisting of indium tin oxide, indium zinc oxide, PbO, SnO, graphite, doped silicium, doped germanium, doped GaAs, doped polyaniline, doped polypyrrole, doped polythiophene, and mixtures of two or more thereof.

Preferably, the cathode layer C contains at least one component selected from the group consisting of Al, Au, Ag, Pt, Cu, Zn, Ni, Fe, Pb, In, W, Pd, LiF, Ca, Ba, Mg, and mixtures or alloys of two or more thereof.

Preferably, the light-emitting layer B is located between an anode layer A and a cathode layer C. Accordingly, the general set-up is preferably A-B-C. This does of course not exclude the presence of one or more optional further layers. These can be present at each side of A, of B and/or of C.

In a preferred embodiment, the organic electroluminescent device comprises at least the following layers:

A) an anode layer A containing at least one component selected from the group consisting of indium tin oxide, indium zinc oxide, PbO, SnO, graphite, doped silicium, doped germanium, doped GaAs, doped polyaniline, doped polypyrrole, doped polythiophene, and mixtures of two or more thereof;

B) the light-emitting layer B; and

C) a cathode layer C containing at least one component selected from the group consisting of Al, Au, Ag, Pt, Cu, Zn, Ni, Fe, Pb, In, W, Pd, LiF, Ca, Ba, Mg, and mixtures or alloys of two or more thereof, wherein the light-emitting layer B is located between the anode layer A and the a cathode layer C.

In one embodiment, when the organic electroluminescent device is an OLED, it may optionally comprise the following layer structure:

A) an anode layer A, exemplarily comprising indium tin oxide (ITO);

HTL) a hole transport layer HTL;

B) a light-emitting layer B according to present invention as described herein;

ETL) an electron transport layer ETL; and

C) a cathode layer, exemplarily comprising Al, Ca and/or Mg.

Preferably, the order of the layers herein is A-HTL-B-ETL-C.

Furthermore, the organic electroluminescent device may optionally comprise one or more protective layers protecting the device from damaging exposure to harmful species in the environment including, exemplarily moisture, vapor and/or gases.

Preferably, the anode layer A is located on the surface of a substrate. The substrate may be formed by any material or composition of materials. Most frequently, glass slides are used as substrates. Alternatively, thin metal layers (e.g., copper, gold, silver or aluminum films) or plastic films or slides may be used. This may allow a higher degree of flexibility. The anode layer A is mostly composed of materials allowing to obtain an (essentially) transparent film. As at least one of both electrodes should be (essentially) transparent in order to allow light emission from the OLED, either the anode layer A or the cathode layer C transparent. Preferably, the anode layer A comprises a large content or even consists of transparent conductive oxides (TCOs).

Such anode layer A may exemplarily comprise indium tin oxide, aluminum zinc oxide, fluor tin oxide, indium zinc oxide, PbO, SnO, zirconium oxide, molybdenum oxide, vanadium oxide, wolfram oxide, graphite, doped Si, doped Ge, doped GaAs, doped polyaniline, doped polypyrrol and/or doped polythiophene.

Particularly preferably, the anode layer A (essentially) consists of indium tin oxide (ITO) (e.g., $(InO_3)_{0.9}(SnO_2)_{0.1}$). The roughness of the anode layer A caused by the transparent conductive oxides (TCOs) may be compensated by using a hole injection layer (HIL). Further, the HIL may facilitate the injection of quasi charge carriers (i.e., holes) in that the transport of the quasi charge carriers from the TCO to the hole transport layer (HTL) is facilitated. The hole injection layer (HIL) may comprise poly-3,4-ethylendioxy thiophene (PEDOT), polystyrene sulfonate (PSS), $MoO_2$, $V_2O_5$, CuPC or CuI, in particular a mixture of PEDOT and PSS. The hole injection layer (HIL) may also prevent the diffusion of metals from the anode layer A into the hole transport layer (HTL). The HIL may exemplarily comprise PEDOT:PSS (poly-3,4-ethylendioxy thiophene: polystyrene sulfonate), PEDOT (poly-3,4-ethylendioxy thiophene), mMTDATA (4,4',4''-tris[phenyl(m-tolyl)amino]triphenylamine), Spiro-TAD (2,2',7,7'-tetrakis(n,n-diphenylamino)-9,9'-spirobifluorene), DNTPD (N1,N1'-(biphenyl-4,4'-diyl)bis(N1-phenyl-N4,N4-di-m-tolylbenzene-1,4-diamine), NPB (N,N'-nis-(1-naphthalenyl)-N,N'-bis-phenyl-(1,1'-biphenyl)-4,4'-diamine), NPNPB (N,N'-diphenyl-N,N'-di-[4-(N,N-diphenyl-amino)phenyl]benzidine), MeO-TPD (N,N,N',N'-tetrakis(4-methoxyphenyl)-benzidine), HAT-CN (1,4,5,8,9,11-hexaazatriphenylen-hexacarbonitrile) and/or Spiro-NPD (N,N'-diphenyl-N,N'-bis-(1-naphthyl)-9,9'-spirobifluorene-2,7-diamine).

Adjacent to the anode layer A or hole injection layer (HIL) typically a hole transport layer (HTL) is located. Herein, any hole transport compound may be used. Exemplarily, electron-rich heteroaromatic compounds such as triarylamines and/or carbazoles may be used as hole transport compound. The HTL may decrease the energy barrier between the anode layer A and the light-emitting layer B (serving as emitting layer (EML)). The hole transport layer (HTL) may also be an electron blocking layer (EBL). Preferably, hole transport compounds bear comparably high energy levels of their triplet states T1. Exemplarily the hole transport layer (HTL) may comprise a star-shaped heterocycle such as tris(4-carbazoyl-9-ylphenyl)amine (TCTA), poly-TPD (poly(4-butylphenyl-diphenyl-amine)), [alpha]-NPD (poly(4-butylphenyl-diphenyl-amine)), TAPC (4,4'-cyclohexyliden-bis[N,N-bis(4-methylphenyl)benzenamine]), 2-TNATA (4,4',4''-tris[2-naphthyl(phenyl)-amino]-triphenylamine), Spiro-TAD, DNTPD, NPB, NPNPB, MeO-TPD, HAT-CN and/or TrisPcz (9,9'-diphenyl-6-(9-phenyl-9H-carbazol-3-yl)-9H,9'H-3,3'-bicarbazole). In addition, the HTL may comprise a p-doped layer, which may be composed of an inorganic or organic dopant in an organic hole-transporting matrix. Transition metal oxides such as vanadium oxide, molybdenum oxide or tungsten oxide may exemplarily be used as inorganic dopant. Tetrafluorotetracyanoquinodimethane (F4-TCNQ), copper-pentafluorobenzoate (Cu(I)pFBz) or transition metal complexes may exemplarily be used as organic dopant.

The EBL may exemplarily comprise mCP (1,3-bis(carbazol-9-yl)benzene), 9,9'-Bis([1,1'-biphenyl]-3-yl)-3,3'-bi-9H-carbazole (CAS 1352040-89-1); TCTA, 2-TNATA, mCBP (3,3-di(9H-carbazol-9-yl)biphenyl), 9-[3-(dibenzofuran-2-yl)phenyl]-9H-carbazole, 9-[3-(dibenzofuran-2-yl)phenyl]-9H-carbazole, 9-[3-(dibenzothiophen-2-yl)phenyl]-9H-carbazole, 9-[3,5-bis(2-dibenzofuranyl)phenyl]-9H-carbazole, 9-[3,5-bis(2-dibenzothiophenyl)phenyl]-9H-carbazole, tris-Pcz, CzSi (9-(4-tert-butylphenyl)-3,6-bis(triphenylsilyl)-9H-carbazole), 3',5'-di-(N-carbazolyl)-[1,1'-biphenyl]-2-carbonitrile (DCPBN; CAS 1918991-70-4), 3-(N-carbazolyl)-N-phenylcarbazole (NCNPC) and/or DCB (N,N'-dicarbazolyl-1,4-dimethylbenzene).

For host compounds, the energy of the first excited triplet state T1 is determined from the onset of the time-gated emission spectrum at 77 K, preferably with a delay time of 1 ms and an integration time of 1 ms, if not otherwise stated measured in a film of poly(methyl methacrylate) (PMMA) with 10% by weight of host.

For small full width at half maximum (FWHM) emitter, the energy of the first excited triplet state T1 is determined from the onset of the time-gated emission spectrum at 77 K, typically with a delay time of 1 ms and an integration time of 1 ms, if not otherwise stated measured in a film of poly(methyl methacrylate) (PMMA) with 1% by weight of emitter.

For phosphorescence compounds, the energy of the first excited triplet state T1 is determined from the onset of the time-gated emission spectrum at room temperature typically with a delay time of 1 ms and an integration time of 1 ms, if not otherwise stated measured in a film of poly(methyl methacrylate) (PMMA) with 10% by weight of emitter.

Orbital and excited state energies can be determined by means of experimental methods known to the person skilled in the art. Experimentally, the energy of the highest occupied molecular orbital $E^{HOMO}$ is determined by methods known to the person skilled in the art from cyclic voltammetry measurements with an accuracy of 0.1 eV. The energy of the lowest unoccupied molecular orbital $E^{LUMO}$ is calculated as $E^{HOMO}+E^{gap}$, where $E^{gap}$ is determined as follows:

For host compounds, the onset of emission of a film with 10% by weight of host in poly(methyl methacrylate) (PMMA), which corresponds to the energy of the first excited singlet state S1, is used as $E^{gap}$, unless stated otherwise.

For small full width at half maximum (FWHM) emitters, the onset of emission of a film with 1% by weight of small full width at half maximum (FWHM) emitter in poly(methyl methacrylate) (PMMA), which corresponds to the energy of the first excited singlet state S1, is used as $E^{gap}$, unless stated otherwise.

For organic Phosphorescence emitters, the onset of emission of a film with 10% by weight of host in poly(methyl methacrylate) (PMMA), which corresponds to the energy of the first excited singlet state S1, is used as $E^{gap}$, unless stated otherwise.

In the electron transport layer (ETL), any electron transporter may be used. Exemplarily, compounds poor of electrons such as, e.g., benzimidazoles, pyridines, triazoles, oxadiazoles (e.g., 1,3,4-oxadiazole), phosphinoxides and sulfone, may be used. Exemplarily, an electron transporter ETM may also be a star-shaped heterocycle such as 1,3,5-tri(1-phenyl-1H-benzo[d]imidazol-2-yl)phenyl (TPBi). The ETM may exemplarily be NBphen (2,9-bis(naphthalen-2-yl)-4,7-diphenyl-1,10-phenanthroline), Alq3 (Aluminum-tris(8-hydroxyquinoline)), TSPO1 (diphenyl-4-triphenylsilylphenyl-phosphinoxide), BPyTP2 (2,7-di(2,2-bipyridin-5-yl)triphenyle), Sif87 (dibenzo[b,d]thiophen-2-yltriphenylsilane), Sif88 (dibenzo[b,d]thiophen-2-yl)diphenylsilane), BmPyPhB (1,3-bis[3,5-di(pyridin-3-yl)phenyl]benzene) and/or BTB (4,4'-bis-[2-(4,6-diphenyl-1,3,5-triazinyl)]-1,1'-biphenyl). Optionally, the electron transport layer may be doped with materials such as Liq (8-hydroxyquinolinolatolithium). Optionally, a second electron transport layer may be located between electron transport layer and the cathode layer C. The electron transport layer (ETL) may also block holes or a hole-blocking layer (HBL) is introduced.

The HBL may, for example, comprise HBM1:

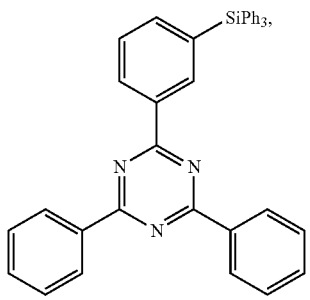

BCP (2,9-dimethyl-4,7-diphenyl-1,10-phenanthroline=Bathocuproine), BAlq (bis(8-hydroxy-2-methylquinoline)-(4-phenylphenoxy)aluminum), NBphen (2,9-bis(naphthalen-2-yl)-4,7-diphenyl-1,10-phenanthroline), Alq3 (Aluminum-tris(8-hydroxyquinoline)), TSPO1 (diphenyl-4-triphenylsilylphenyl-phosphinoxide), T2T (2,4,6-tris(biphenyl-3-yl)-1,3,5-triazine), T3T (2,4,6-tris(triphenyl-3-yl)-1,3,5-triazine), TST (2,4,6-tris(9,9'-spirobifluorene-2-yl)-1,3,5-triazine), DTST (2,4-diphenyl-6-(3'-triphenylsilylphenyl)-1,3,5-triazine), DTDBF (2,8-bis(4,6-diphenyl-1,3,5-triazinyl)dibenzofurane) and/or TCB/TCP (1,3,5-tris(N-carbazolyl)benzol/1,3,5-tris(carbazol)-9-yl)benzene).

Adjacent to the electron transport layer (ETL), a cathode layer C may be located. Exemplarily, the cathode layer C may comprise or may consist of a metal (e.g., Al, Au, Ag, Pt, Cu, Zn, Ni, Fe, Pb, LiF, Ca, Ba, Mg, In, W, or Pd) or a metal alloy. For practical reasons, the cathode layer C may also consist of (essentially) intransparent metals such as Mg, Ca or Al. Alternatively or additionally, the cathode layer C may also comprise graphite and or carbon nanotubes (CNTs). Alternatively, the cathode layer C may also consist of nanoscale silver wires.

An OLED may further, optionally, comprise a protection layer between the electron transport layer (ETL) D and the cathode layer C (which may be designated as electron injection layer (EIL)). This layer may comprise lithium fluoride, caesium fluoride, silver, Liq (8-hydroxyquinolinolatolithium), $Li_2O$, $BaF_2$, MgO and/or NaF.

As used herein, if not defined more specifically in a particular context, the designation of the colors of emitted and/or absorbed light is as follows:
violet: wavelength range of >380-420 nm;
deep blue: wavelength range of >420-475 nm;
sky blue: wavelength range of >475-500 nm;
green: wavelength range of >500-560 nm;
yellow: wavelength range of >560-580 nm;
orange: wavelength range of >580-620 nm;
red: wavelength range of >620-800 nm.

If not stated otherwise, with respect to small FWHM emitters such colors refer to the emission maximum $\lambda_{max}^{PMMA}$ of a poly(methyl methacrylate) (PMMA) film with 1% by weight of the emitter. For phosphorescence materials and host materials such colors refer to the emission maximum $\lambda_{max}^{PMMA}$ of a poly(methyl methacrylate) (PMMA) film with 10%, If not stated otherwise.

Therefore, exemplarily, a deep blue emitter has an emission maximum $\lambda_{max}^{PMMA}$ in the range of from 420 to 475 nm, a sky blue emitter has an emission maximum $\lambda_{max}^{PMMA}$ in the range of from 475 to 500 nm, a green emitter has an emission maximum $\lambda_{max}^{PMMA}$ in a range of from 500 to 560 nm, a red emitter has an emission maximum $\lambda_{max}^{PMMA}$ in a range of from 620 to 800 nm.

Accordingly, a further embodiment of the present invention relates to an OLED, which exhibits an external quantum efficiency at 1000 cd/m$^2$ of more than 10%, more preferably of more than 13%, more preferably of more than 15%, even more preferably of more than 18% or even more than 20% and/or exhibits an emission maximum between 490 nm and 600 nm, preferably between 500 nm and 580 nm, more preferably between 510 nm and 560 nm, even more preferably between 520 nm and 540 nm and/or exhibits a LT95 value at constant current density $J_0$=15 mA/cm$^2$ of more than 100 h, preferably more than 200 h, more preferably more than 400 h, even more preferably more than 750 h or even more than 1000 h.

A further embodiment of the present invention relates to an OLED, which emits light at a distinct color point. According to the present invention, the OLED emits light with a narrow emission band (small full width at half maximum (FWHM)). In a preferred embodiment, the OLED according to the invention emits light with a FWHM of the main emission peak of below 0.25 eV, more preferably of below 0.20 eV, even more preferably of below 0.15 eV or even below 0.13 eV.

A further embodiment of the present invention relates to an OLED, which emits light with CIEx and CIEy color coordinates close to the CIEx (=0.170) and CIEy (=0.797) color coordinates of the primary color green (CIEx=0.170 and CIEy=0.797) as defined by ITU-R Recommendation BT.2020 (Rec. 2020) and thus is suited for the use in Ultra High Definition (UHD) displays, e.g. UHD-TVs. In this context, the term "close to" refers to the ranges of CIEx and CIEy coordinates provided at the end of this paragraph. In commercial applications, typically top-emitting (top-electrode is transparent) devices are used, whereas test devices as used throughout the present application represent bottom-emitting devices (bottom-electrode and substrate are transparent). Accordingly, a further aspect of the present invention relates to an OLED, whose emission exhibits a CIEx color coordinate of between 0.15 and 0.45 preferably between 0.15 and 0.35, more preferably between 0.15 and 0.30 or even more preferably between 0.15 and 0.25 or even between 0.15 and 0.20 and/or a CIEy color coordinate of between 0.60 and 0.92, preferably between 0.65 and 0.90, more preferably between 0.70 and 0.88 or even more preferably between 0.75 and 0.86 or even between 0.79 and 0.84.

A further embodiment of the present invention relates to an OLED, which emits light with CIEx and CIEy color coordinates close to the CIEx (=0.265) and CIEy (=0.65) color coordinates of the primary color green (CIEx=0.265 and CIEy=0.65) as defined by DCIP3. In this context, the term "close to" refers to the ranges of CIEx and CIEy coordinates provided at the end of this paragraph. In commercial applications, typically top-emitting (top-electrode is transparent) devices are used, whereas test devices as used throughout the present application represent bottom-emitting devices (bottom-electrode and substrate are transparent). Accordingly, a further aspect of the present invention relates to an OLED, whose bottom emission exhibits a CIEx color coordinate of between 0.2 and 0.45 preferably between 0.2 and 0.35 or more preferably between 0.2 and 0.30 or even more preferably between 0.24 and 0.28 or even between 0.25 and 0.27 and/or a CIEy color coordinate of between 0.60 and 0.9, preferably between 0.6 and 0.8, more preferably between 0.60 and 0.70 or even more preferably between 0.62 and 0.68 or even between 0.64 and 0.66.

As used throughout the present application, the terms "aryl" and "aromatic" may be understood in the broadest sense as any mono-, bi- or polycyclic aromatic moieties. In one embodiment, an aryl residue may be a $C_6$ to $C_{18}$ aryl residue. In one embodiment, an aryl residue may be a $C_6$ to $C_{14}$ aryl residue or a $C_6$ to $C_{10}$ aryl residue. More specific definitions are provided in the context of the respective compounds above. If not otherwise indicated, an aryl may also be optionally substituted by one or more substituents which are exemplified further throughout the present application. Accordingly, the term "arylene" refers to a divalent residue that bears two binding sites to other molecular structures and thereby serving as a linker structure. As used throughout the present application, the terms "heteroaryl" and "heteroaromatic" may be understood in the broadest sense as any mono-, bi- or polycyclic heteroaromatic moieties that include at least one heteroatom, in particular which bear from one to three heteroatoms per aromatic ring. In one embodiment, a heteroaryl residue may be a $C_2$ to $C_{17}$ aryl residue. In one embodiment, a heteroaryl residue may be a $C_2$ to $C_{13}$ aryl residue or a $C_2$ to $C_{13}$ aryl residue.

Exemplarily, a heteroaromatic compound may be pyrrole, furan, thiophene, imidazole, oxazole, thiazole, triazole, pyrazole, pyridine, pyrazine and pyrimidine, and the like. If not otherwise indicated, a heteroaryl may also be optionally substituted by one or more substituents which are exemplified further throughout the present application. Accordingly, the term "heteroarylene" refers to a divalent residue that bears two binding sites to other molecular structures and thereby serving as a linker structure.

If not stated otherwise, percentages refer to weight percentages ((weight/weight), (w/w), wt. %).

As used throughout the present application, the term "alkyl" may be understood in the broadest sense as both, linear or branched chain alkyl residue. Preferred alkyl residues are those containing from one to fifteen carbon atoms. Exemplarily, an alkyl residue may be methyl, ethyl, propyl, isopropyl, butyl, isobutyl, tert-butyl, and the like. If not otherwise indicated, an alkyl may also be optionally substituted by one or more substituents which are exemplified further throughout the present application. Accordingly, the term "alkylene" refers to a divalent residue that bears two binding sites to other molecular structures and thereby serving as a linker structure.

If not otherwise indicated, as used herein, in particular in the context of aryl, arylene, heteroaryl, alkyl and the like, the term "substituted" may be understood in the broadest sense. Preferably, such substitution means a residue selected from the group consisting of $C_1$-$C_{20}$-alkyl, $C_7$-$C_{19}$-alkaryl, and $C_6$-$C_{18}$-aryl. Accordingly, preferably, no charged moiety, more preferably no functional group is present in such substitution.

It will be noticed that hydrogen can, at each occurrence, be replaced by deuterium.

Unless otherwise specified, any of the layers of the various embodiments may be deposited by any suitable method. The layers in the context of the present invention, including the light-emitting layer B, may optionally be prepared by means of liquid processing (also designated as "film processing", "fluid processing", "solution processing" or "solvent processing"). This means that the components comprised in the respective layer are applied to the surface of a part of a device in liquid state. Preferably, the layers in the context of the present invention, including the light-emitting layer B, may be prepared by means of spin-coating. This method well-known to those skilled in the art allows obtaining thin and (essentially) homogeneous layers.

Alternatively, the layers in the context of the present invention, including the light-emitting layer B, may be prepared by other methods based on liquid processing such as, e.g., casting (e.g., drop-casting) and rolling methods, and printing methods (e.g., inkjet printing, gravure printing, blade coating). This may optionally be carried out in an inert atmosphere (e.g., in a nitrogen atmosphere).

In another preferred embodiment, the layers in the context of the present invention may be prepared by any other method known in the art, including but not limited to vacuum processing methods well-known to those skilled in the art such as, e.g., thermal (co-)evaporation, organic vapor phase deposition (OVPD), and deposition by organic vapor jet printing (OVJP).

When preparing layers by means of liquid processing, the solutions including the components of the layers (i.e., with respect to the light-emitting layer B of the present invention, at least one host compound $H^P$ and, typically, at least one phosphorescence material $E^B$, at least small full width at half maximum (FWHM) emitter $S^B$ and optionally one or more other host compounds $H^N$) may further comprise a volatile organic solvent. Such volatile organic solvent may optionally be one selected from the group consisting of tetrahydrofuran, dioxane, chlorobenzene, diethylene glycol diethyl ether, 2-(2-ethoxyethoxy)ethanol, gamma-butyrolactone, N-methyl pyrrolidinon, ethoxyethanol, xylene, toluene, anisole, phenetol, acetonitrile, tetrahydrothiophene, benzonitrile, pyridine, trihydrofuran, triarylamine, cyclohexanone, acetone, propylene carbonate, ethyl acetate, benzene and PGMEA (propylen glycol monoethyl ether acetate). Also a combination of two or more solvents may be used. After applied in liquid state, the layer may subsequently be dried and/or hardened by any means of the art, exemplarily at ambient conditions, at increased temperature (e.g., about 50° C. or about 60° C.) or at diminished pressure.

Optionally, an organic electroluminescent device (e.g., an OLED) may exemplarily be an essentially white organic electroluminescent device or a blue organic electroluminescent device. Exemplarily such white organic electroluminescent device may comprise at least one (deep) blue emitter compound and one or more emitter compounds emitting green (e.g. phosphorescence material $E^B$ or small FWHM emitter $S^B$) and/or red light. Then, there may also optionally be energy transmittance between two or more compounds as described above.

The organic electroluminescent device as a whole may also form a thin layer of a thickness of not more than 5 mm, more than 2 mm, more than 1 mm, more than 0.5 mm, more than 0.25 mm, more than 100 µm, or more than 10 µm.

An organic electroluminescent device (e.g., an OLED) may be a small-sized (e.g., having a surface not larger than 5 mm², or even not larger than 1 mm²), medium-sized (e.g., having a surface in the range of 0.5 to 20 cm²), or a large-sized (e.g., having a surface larger than 20 cm²). An organic electroluminescent device (e.g., an OLED) according to the present invention may optionally be used for generating screens, as large-area illuminating device, as luminescent wallpaper, luminescent window frame or glass, luminescent label, luminescent poser or flexible screen or display. Next to the common uses, an organic electroluminescent device (e.g., an OLED) may exemplarily also be used as luminescent films, "smart packaging" labels, or innovative design elements. Further they are usable for cell detection and examination (e.g., as bio labelling).

One of the main purposes of an organic electroluminescent device is the generation of light. Thus, the present invention further relates to a method for generating light of a desired wavelength range, comprising the step of providing an organic electroluminescent device according to any of the present invention.

Accordingly, a further aspect of the present invention relates to a method for generating light of a desired wavelength range, comprising the steps of
(i) providing an organic electroluminescent device according to the present invention; and
(ii) applying an electrical current to said organic electroluminescent device.

A further aspect of the present invention relates to a process of making the organic electroluminescent devices by assembling the elements described above. The present invention also relates to a method for generating green light, in particular by using said organic electroluminescent device.

The application further comprises the following embodiments:
1. An organic electroluminescent device comprising a light-emitting layer B comprising:
   (i) a host material $H^P$, which has a lowermost excited singlet state energy level $S1^P$ and a lowermost excited triplet state energy level $T1^P$, a highest occupied molecular orbital HOMO($H^P$) having an energy $E^{HOMO}(H^P)$ and a lowest unoccupied molecular orbital LUMO($H^P$) having an energy $E^{LUMO}(H^P)$;
   (ii) a phosphorescence material $E^B$, which has a lowermost excited singlet state energy level $S1^E$ and a lowermost excited triplet state energy level $T1^E$, a highest occupied molecular orbital HOMO($E^E$) having an energy $E^{HOMO}(E^E)$ and a lowest unoccupied molecular orbital LUMO($E^E$) having an energy $E^{LUMO}(E^E)$; and
   (iii) a small full width at half maximum (FWHM) emitter $S^B$ which has a lowermost excited singlet state energy level $S1^S$ and a lowermost excited triplet state energy level $T1^S$, a highest occupied molecular orbital HOMO ($E^S$) having an energy $E^{HOMO}(E^S)$ and a lowest unoccupied molecular orbital LUMO($E^S$) having an energy $E^{LUMO}(E^S)$,
   wherein $E^B$ transfers energy to $S^B$ and $S^B$ emits light with an emission maximum between 500 nm to 560 nm,
   and wherein the relations expressed by the following formulas (1) to (4) apply:

$$T1^E > S1^S \tag{1}$$

$$T1^P > T1^S \tag{2}$$

$$T1^P > T1^E \tag{3}$$

$$T1^P > S1^E \tag{4}$$

2. The organic electroluminescent device according to embodiment 1, wherein the small FWHM emitter $S^B$ is characterized in that it has an emission spectrum, which exhibits a full width at half maximum (FWHM) of less than or equal to 0.25 eV.
3. The organic electroluminescent device according to any of embodiments 1 or 2, wherein the device exhibits an emission maximum $\lambda^{max}(D)$ of 500 nm to 560 nm.
4. The organic electroluminescent device according to any of embodiments 1 to 3, wherein the small FWHM emitter $S^B$ emits light with an emission maximum between 510 nm to 550 nm.
5. The organic electroluminescent device according to any of embodiments 1 to 4, wherein the device exhibits an emission maximum $\lambda^{max}(D)$ of 510 nm to 550 nm.
6. The organic electroluminescent device according to any of embodiments 1 to 5, wherein light-emitting layer B additionally comprises
   (iv) a host material $H^N$, which has a lowermost excited singlet state energy level $S1^N$, a lowermost excited triplet state energy level $T1^N$, a highest occupied molecular orbital HOMO($H^N$) having an energy $E^{HOMO}(H^N)$ and a lowest unoccupied molecular orbital LUMO($H^N$) having an energy $E^{LUMO}(H^N)$;
   wherein the relations expressed by the following formulas (2N), (3N), and (4N) apply:

$$T1^N > T1^S \tag{2N}$$

$$T1^N > T1^E \tag{3N}$$

$$T1^N > S1^E \tag{4N}$$

and wherein the relations expressed by the following formulas (5) to (11) apply:

$$E^{LUMO}(H^P) > E^{LUMO}(S^B) \tag{5}$$

$$E^{LUMO}(H^P) > E^{LUMO}(E^B) \tag{6}$$

$$E^{HOMO}(H^P) < E^{HOMO}(E^B) \tag{7}$$

$$E^{LUMO}(H^N) < E^{LUMO}(S^B) \quad (8)$$

$$E^{HOMO}(H^N) < E^{HOMO}(S^B) \quad (9)$$

$$E^{LUMO}(H^N) < E^{LUMO}(E^B) \quad (10)$$

$$E^{HOMO}(H^N) < E^{HOMO}(E^B) \quad (11)$$

7. The organic electroluminescent device according to any of embodiments 1 to 6, wherein the small FWHM emitter $S^B$ is selected from the group consisting of a fluorescent emitter and a thermally activated delayed fluorescence (TADF) emitter.

8. The organic electroluminescent device according to any of embodiments 1 to 7, wherein the small FWHM emitter $S^B$ is a boron-based material.

9. The organic electroluminescent device according to any of embodiments 1 to 8, wherein the small FWHM emitter $S^B$ is characterized in that it has a $\Delta E_{ST}$ value, which corresponds to the energy difference between $S1^S$ and $T1^S$, of less than 0.4 eV.

10. The organic electroluminescent device according to any of embodiments 1 to 9, wherein the phosphorescence material $E^B$ comprises or consists of a structure of formula I,

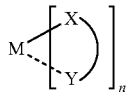

Formula I wherein

M is selected from the group consisting of Ir, Pt, Au, Eu, Ru, Re, Ag, and Cu;

n is an integer of 1 to 3,

X and Y are each independently a bidentate monoanionic ligand.

11. The organic electroluminescent device according to any of embodiments 1 to 10, wherein the light-emitting layer B comprises:
 (i) 22-70% by weight of the host compound $H^P$;
 (ii) 0-70% by weight of the host compound $H^N$;
 (iii) 5-10% by weight of the phosphorescence material $E^B$; and
 (iv) 1-5% by weight of the emitter $S^B$; and optionally
 (v) 0-72% by weight of one or more solvents.

12. The organic electroluminescent device according to any of embodiments 1 to 11, wherein the light-emitting layer B comprises:
 (i) 10-30% by weight of the host compound $H^P$;
 (ii) 40-74% by weight of the host compound $H^N$;
 (iii) 15-30% by weight of the phosphorescence material $E^B$; and
 (iv) 1-5% by weight of the emitter $S^B$; and optionally
 (v) 0-34% by weight of one or more solvents.

13. A method for generating green light at a wavelength of from 500 to 560 nm, comprising the steps of:
 (i) providing an organic electroluminescent device according to any of embodiments 1 to 12; and
 (ii) applying an electrical current to said organic electroluminescent device.

The Examples and claims further illustrate the invention.

EXAMPLES

Cyclic Voltammetry

Cyclic voltammograms of solutions having concentration of $10^{-3}$ mol/l of the organic molecules in dichloromethane or a suitable solvent and a suitable supporting electrolyte (e.g. 0.1 mol/l of tetrabutylammonium hexafluorophosphate) are measured. The measurements are conducted at room temperature and under nitrogen atmosphere with a three-electrode assembly (Working and counter electrodes: Pt wire, reference electrode: Pt wire) and calibrated using $FeCp_2/FeCp_2^+$ as internal standard. HOMO data was corrected using ferrocene as internal standard against SCE.

Density Functional Theory Calculation

Molecular structures are optimized employing the BP86 functional and the resolution of identity approach (RI). Excitation energies are calculated using the (BP86) optimized structures employing Time-Dependent DFT (TD-DFT) methods. Orbital and excited state energies are calculated with the B3LYP functional. Def2-SVP basis sets (and a m4-grid for numerical integration were used. The Turbomole program package was used for all calculations.

Photophysical Measurements

Sample pretreatment: Spin-coating

Apparatus: Spin150, SPS euro.

The sample concentration is 10 mg/ml, dissolved in a suitable solvent.

Program: 1) 3 s at 400 U/min; 20 s at 1000 U/min at 1000 Upm/s. 3) 10 s at 4000 U/min at 1000 Upm/s. After coating, the films are tried at 70° C. for 1 min.

Photoluminescence Spectroscopy and TCSPC (Time-Correlated Single-Photon Counting)

Steady-state emission spectroscopy is recorded using a Horiba Scientific, Modell FluoroMax-4 equipped with a 150 W Xenon-Arc lamp, excitation- and emissions monochromators and a Hamamatsu R928 photomultiplier and a time-correlated single-photon counting option. Emissions and excitation spectra are corrected using standard correction fits.

Excited state lifetimes are determined employing the same system using the TCSPC method with FM-2013 equipment and a Horiba Yvon TCSPC hub.

Excitation Sources:

NanoLED 370 (wavelength: 371 nm, puls duration: 1.1 ns)

NanoLED 290 (wavelength: 294 nm, puls duration: <1 ns)

SpectraLED 310 (wavelength: 314 nm)

SpectraLED 355 (wavelength: 355 nm).

Data analysis (exponential fit) was done using the software suite DataStation and DAS6 analysis software. The fit is specified using the chi-squared-test.

Photoluminescence Quantum Yield Measurements

For photoluminescence quantum yield (PLQY) measurements an Absolute PL Quantum Yield Measurement $C_{9920}$-03G system (Hamamatsu Photonics) is used. Quantum yields and CIE coordinates were determined using the software U6039-05 version 3.6.0.

Emission maxima are given in nm, quantum yields φ in % and CIE coordinates as x,y values.

PLQY was determined using the following protocol:

1) Quality assurance: Anthracene in ethanol (known concentration) is used as reference 2) Excitation wavelength: the absorption maximum of the organic molecule is determined and the molecule is excited using this wavelength 3) Measurement Quantum yields are measured for sample of solutions or films under nitrogen atmosphere. The yield is calculated using the equation:

$$\Phi_{PL} = \frac{n_{photon}, \text{emited}}{n_{photon}, \text{absorbed}} = \frac{\int \frac{\lambda}{hc}[Int_{emitted}^{sample}(\lambda) - Int_{absorbed}^{sample}(\lambda)]d\lambda}{\int \frac{\lambda}{hc}[Int_{emitted}^{reference}(\lambda) - Int_{absorbed}^{reference}(\lambda)]d\lambda}$$

wherein $n_{photon}$ denotes the photon count and Int. is the intensity.

Production and Characterization of Organic Electroluminescence Devices

Via vacuum-deposition methods OLED devices comprising organic molecules according to the invention can be produced. If a layer contains more than one compound, the weight-percentage of one or more compounds is given in %. The total weight-percentage values amount to 100%, thus if a value is not given, the fraction of this compound equals to the difference between the given values and 100%.

The not fully optimized OLEDs are characterized using standard methods and measuring electroluminescence spectra, the external quantum efficiency (in %) in dependency on the intensity, calculated using the light detected by the photodiode, and the current. The OLED device lifetime is extracted from the change of the luminance during operation at constant current density. The LT50 value corresponds to the time, where the measured luminance decreased to 50% of the initial luminance, analogously LT80 corresponds to the time point, at which the measured luminance decreased to 80% of the initial luminance, LT95 to the time point, at which the measured luminance decreased to 95% of the initial luminance etc.

Accelerated lifetime measurements are performed (e.g. applying increased current densities). Exemplarily LT80 values at 500 cd/m² are determined using the following equation:

$$LT80\left(500\frac{cd^2}{m^2}\right) = LT80(L_0)\left(\frac{L_0}{500\frac{cd^2}{m^2}}\right)^{1.6}$$

wherein $L_0$ denotes the initial luminance at the applied current density.

The values correspond to the average of several pixels (typically two to eight), the standard deviation between these pixels is given. Figures show the data series for one OLED pixel.

Experimental Results

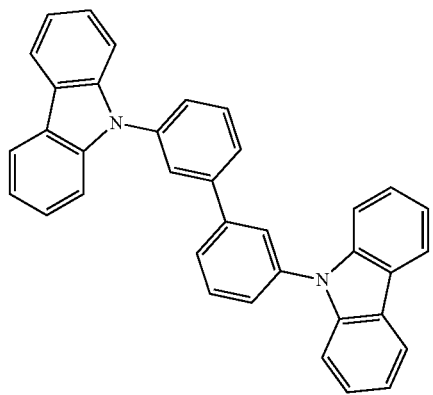

mCBP (host $H^P$)

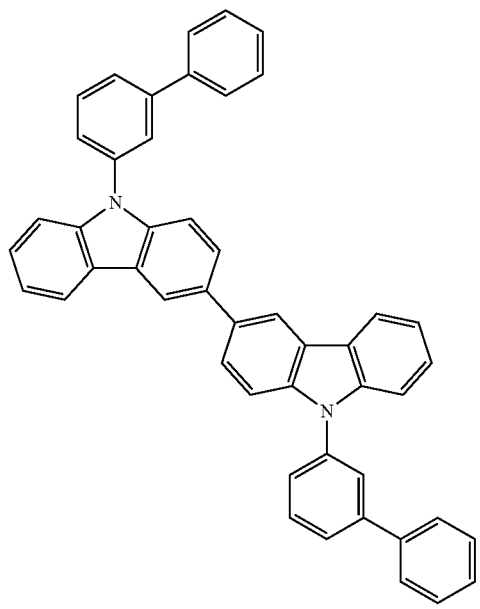

Host P1 (host $H^P$)

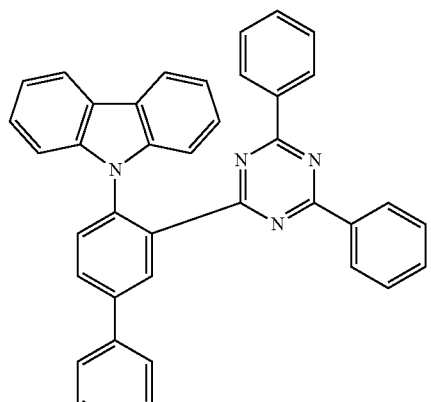

Host N1 (host $H^N$)

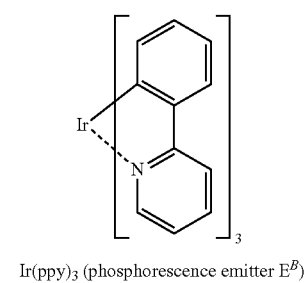
Ir(ppy)₃ (phosphorescence emitter E^B)
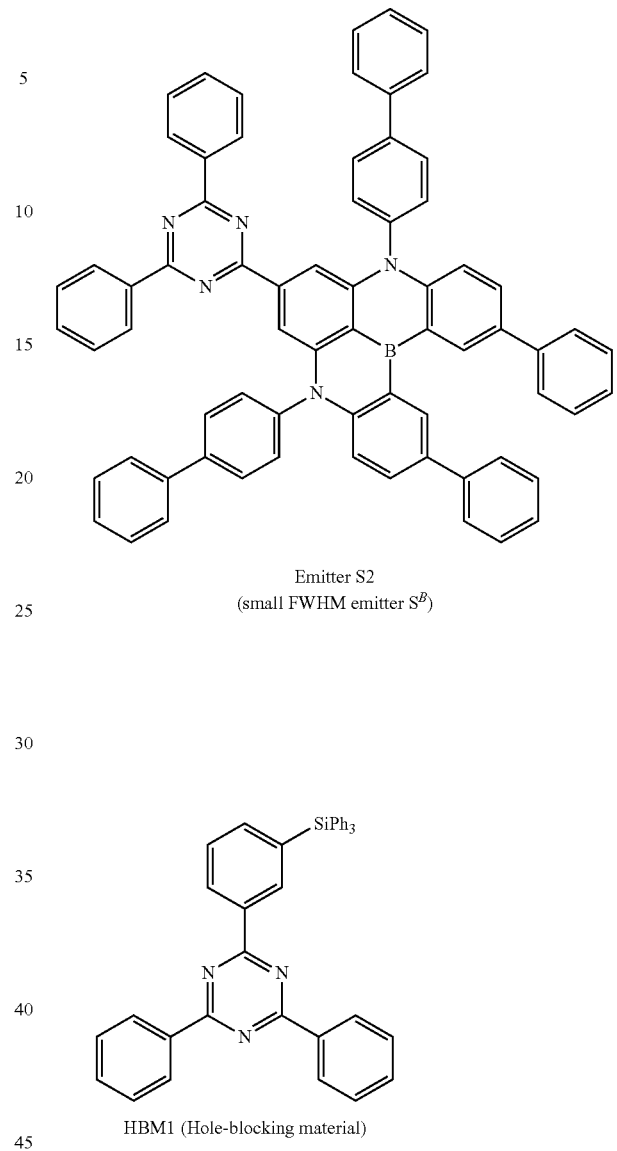
Emitter S1
(small FWHM emitter S^B)
Emitter S2
(small FWHM emitter S^B)
HBM1 (Hole-blocking material)
TABLE 1
Properties of the materials.
|  | Example compound | HOMO [eV] | LUMO$_{CV}$ [eV] | E$^{LUMO}$ [eV] | S1 [eV] | T1 [eV] | $\lambda_{max}^{PMMA}$ [nm] | FWHM [eV] |
|---|---|---|---|---|---|---|---|---|
| H$^P$ | mCBP | −6.02 |  | −2.42 | 3.6 | 2.82 |  |  |
|  | Host P1 | −5.66 |  | −2.35 | 3.31 | 2.71 |  |  |
| H$^N$ | Host N1 | −5.95 | −2.87 | −2.97 | 2.98 | 2.77 | 460 | 0.42 |
| E$^B$ | Ir(ppy)₃ | −5.36 |  |  |  | 2.56 | 509 | 0.38 |
| S$^B$ | Emitter S1 | −5.55 | −2.95 | −3.05 | 2.53 |  | 514 | 0.18 |
|  | Emitter S2 | −5.54 | −3.05 | −3.09 | 2.45 | 2.12 | 534 | 0.22 | wherein $LUMO_{CV}$ is the energy of the lowest unoccupied molecular orbital, which is determined by Cyclic voltammetry.

TABLE 2

Setup of an example organic electroluminescent device (OLED) H and comparison example OLEDs D and P.

| Layer | Thickness | D | P | H |
|---|---|---|---|---|
| 10 | 100 nm | Al | Al | Al |
| 9 | 2 nm | Liq | Liq | Liq |
| 8 | 20 nm | NBPhen | NBPhen | NBPhen |
| 7 | 10 nm | HBM1 | HBM1 | HBM1 |
| 6 | 50 nm | $H^P$: $H^N$: $S^B$ | $H^P$: $H^N$: $E^B$ | $H^P$: $H^N$: $E^B$: $S^B$ |
| 5 | 10 nm | $H^P$ | $H^P$ | $H^P$ |
| 4 | 10 nm | TCTA | TCTA | TCTA |
| 3 | 50 nm | NPB | NPB | NPB |
| 2 | 5 nm | HAT-CN | HAT-CN | HAT-CN |
| 1 | 50 nm | ITO | ITO | ITO |
| substrate | | glass | glass | glass |

In order to evaluate the results of the invention, comparison experiments were performed, wherein solely the composition of the emission layer (6) was varied. Additionally, the ratio of $H^P$ and $H^N$ was kept constant in the comparison experiments.

TABLE 3

Results I for Emitter S1
Setup of the emission layer (the percentages refer to weight percent):

| Layer | D | P | H |
|---|---|---|---|
| Emission layer (6A) | ($H^P$; 66%): ($H^N$; 33%): ($S^B$; 1%) | $H^P$ (62%): $H^N$ (31%): $E^B$ (7%) | $H^P$ (61.6%): $H^N$ (30.5%): $E^B$ (7%) $S^B$ (1%) | wherein mCBP was used as $H^P$, Host N1 as $H^N$, Ir(ppy)$_3$ as $E^B$, and Emitter S1 as $S^B$; percentages are weight percentages.

TABLE 4

Device results

| Device type | FWHM [eV] | $\lambda_{max}$ [nm] | CIEx | CIEy | Voltage at 10 mA/cm² | EQE at 1000 nits | relative Lifetime |
|---|---|---|---|---|---|---|---|
| D | 0.14 | 514 | 0.203 | 0.652 | 5.25 | 6.6 | — |
| P | 0.30 | 514 | 0.3 | 0.63 | 5.52 | 22.8 | 1 |
| H | 0.20 | 516 | 0.263 | 0.658 | 5.46 | 22.4 | 1.16 |

TABLE 5

Results II for Emitter S1
Setup of the emission layer (the percentages refer to weight percent):

| Layer | D | P | H |
|---|---|---|---|
| Emission layer (6B) | ($H^P$; 66%): ($H^N$; 33%): ($S^B$; 1%) | $H^P$ (60%): $H^N$ (30%): $E^B$ (10%) | $H^P$ (59.6%): $H^N$ (29.5%): $E^B$ (10%) $S^B$ (1%) | wherein mCBP was used as $H^P$, Host N1 as $H^N$, Ir(ppy)$_3$ as $E^B$, and Emitter S1 as $S^B$; percentages are weight percentages.

TABLE 6

Device results

| Device type | FWHM [eV] | $\lambda_{max}$ [nm] | CIEx | CIEy | Voltage at 10 mA/cm² | EQE at 1000 nits | relative Lifetime |
|---|---|---|---|---|---|---|---|
| D | 0.14 | 514 | 0.203 | 0.652 | 5.25 | 6.6 | — |
| P | 0.30 | 514 | 0.3 | 0.63 | 5.5 | 23.6 | 1.00 |
| H | 0.20 | 516 | 0.266 | 0.657 | 5.4 | 22.3 | 1.44 |

TABLE 7

Results III for Emitter S1
Setup of the emission layer (the percentages refer to weight percent):

| Layer | D | P | H |
|---|---|---|---|
| Emission layer (6C) | ($H^P$; 66%): ($H^N$; 33%): ($S^B$; 1%) | $H^P$ (62%): $H^N$ (31%): $E^B$ (7%) | $H^P$ (61.6%): $H^N$ (30.5%): $E^B$ (7%) $S^B$ (1%) | wherein Host P1 was used as $H^P$, Host N1 as $H^N$, Ir(ppy)$_3$ as $E^B$, and Emitter S1 as $S^B$; percentages are weight percentages.

TABLE 8

Device Results

| Device type | FWHM [eV] | $\lambda_{max}$ [nm] | CIEx | CIEy | Voltage at 10 mA/cm² | EQE at 1000 nits | relative Lifetime |
|---|---|---|---|---|---|---|---|
| D | 0.15 | 514 | 0.208 | 0.652 | 4.16 | 8.5 | — |
| P | 0.30 | 514 | 0.301 | 0.631 | 4.76 | 23.6 | 1.00 |
| H | 0.21 | 516 | 0.267 | 0.657 | 4.76 | 24.2 | 1.10 |

TABLE 9

Results I for emitter S2
Setup of the emission layer (the percentages refer to weight percent):

| Layer | D | P | H |
|---|---|---|---|
| Emission layer (6D) | ($H^P$; 66%): ($H^N$; 33%): ($S^B$; 1%) | $H^P$ (62%): $H^N$ (31%): $E^B$ (7%) | $H^P$ (61.6%): $H^N$ (30.5%): $E^B$ (7%) $S^B$ (1%) | wherein mCBP was used as $H^P$, Host N1 as $H^N$, Ir(ppy)$_3$ as $E^B$, and Emitter S2 as $S^B$; percentages are weight percentages.

TABLE 10

Device Results

| Device type | FWHM [eV] | $\lambda_{max}$ [nm] | CIEx | CIEy | Voltage at 10 mA/cm² | EQE at 1000 nits | relative Lifetime |
|---|---|---|---|---|---|---|---|
| D | 0.15 | 532 | 0.306 | 0.65 | 5.5 | 6.3 | — |
| P | 0.30 | 514 | 0.3 | 0.63 | 5.52 | 22.8 | 1.00 |
| H | 0.16 | 532 | 0.32 | 0.65 | 5.8 | 22.8 | 2.40 |

TABLE 11

Results II for emitter S2
Setup of the emission layer (the percentages refer to weight percent):

| Layer | D | P | H |
|---|---|---|---|
| Emission layer (6E) | ($H^P$; 66%): ($H^N$; 33%): ($S^B$; 1%) | $H^P$ (62%): $H^N$ (31%): $E^B$ (7%) | $H^P$ (61.6%): $H^N$ (30.5%): $E^B$ (7%) $S^B$ (1%) | wherein Host P1 was used as $H^P$, Host N1 as $H^N$, Ir(ppy)$_3$ as $E^B$, and Emitter S2 as $S^B$; percentages are weight percentages.

TABLE 12

Device Results

| Device type | FWHM [eV] | $\lambda_{max}$ [nm] | CIEx | CIEy | Voltage at 10 mA/cm² | EQE at 1000 nits | relative Lifetime |
|---|---|---|---|---|---|---|---|
| D | 0.15 | 532 | 0.293 | 0.643 | 4.4 | 7.6 | — |
| P | 0.31 | 516 | 0.31 | 0.625 | 5.0 | 21.3 | 1.00 |
| H | 0.17 | 532 | 0.32 | 0.65 | 5.1 | 23.4 | 1.60 |

For all H-type devices using mCBP as $H^P$ and 7% Ir(ppy)$_3$ as $E^B$, an extension of the relative lifetime of 16% (from 1.00 to 1.16) can be observed for Emitter S1 and an extension of the relative lifetime of 140% (from 1.00 to 2.40) can be observed for Emitter S2, whereas the efficiency stayed almost constant (at almost EQE=23%) and the FWHM decreased by 33% for Emitter S1 (from 0.30 eV to 0.20 eV) and 46% for Emitter S2 (from 0.30 eV to 0.16 eV), the color point was improved for a green application towards CIEx=0.26, CIEy=0.66 for Emitter S1 and CIEx=0.32 and CIEy=0.65 for Emitter S2.

For all H-type devices using Host P1 as $H^P$ and 7% Ir(ppy)$_3$ as $E^B$, an extension of the relative lifetime of 10% (from 1.00 to 1.10) for Emitter S1 can be observed and an extension of the relative lifetime of 60% (from 1.00 to 1.60) for Emitter S2 can be observed, whereas the efficiency stayed almost constant (at almost EQE=24%) and the FWHM decreased by 30% for Emitter S1 (from 0.30 to 0.21) and 45% for Emitter S2 (from 0.31 to 0.17) and the color point was improved for an green application towards CIEx=0.26, CIEy=0.66 for Emitter S1 and CIEx=0.32 and CIEy=0.65 for Emitter S2.

For all H-type devices using Host P1 as $H^P$ and 10% Ir(ppy)$_3$ as $E^B$, and Emitter S2 as $S^B$, an extension of the relative lifetime of 44% (from 1.00 to 1.40) can be observed, whereas the efficiency stayed almost constant (at almost EQE=24%) and the FWHM decreased by 33% (from 0.30 to 0.21) and the color point was improved for an green application towards CIEx=0.26, CIEy=0.66.

The invention claimed is:

1. An organic electroluminescent device comprising a light-emitting layer B comprising:
   (i) a host material $H^P$, which has a lowermost excited singlet state energy level $S1^P$ and a lowermost excited triplet state energy level $T1^P$, a highest occupied molecular orbital HOMO($H^P$) having an energy $E^{HOMO}(H^P)$ and a lowest unoccupied molecular orbital LUMO($H^P$) having an energy $E^{LUMO}(H^P)$;
   (ii) a phosphorescence material $E^B$, which has a lowermost excited singlet state energy level $S1^E$ and a lowermost excited triplet state energy level $T1^E$, a highest occupied molecular orbital HOMO($E^E$) having an energy $E^{HOMO}(E^E)$ and a lowest unoccupied molecular orbital LUMO($E^E$) having an energy $E^{LUMO}(E^E)$; and
   (iii) a small full width at half maximum (FWHM) emitter $S^B$, which has a lowermost excited singlet state energy level $S1^S$ and a lowermost excited triplet state energy level $T1^S$, a highest occupied molecular orbital HOMO($E^S$) having an energy $E^{HOMO}(E^S)$ and a lowest unoccupied molecular orbital LUMO($E^S$) having an energy $E^{LUMO}(E^S)$,
   wherein $E^B$ transfers energy to $S^B$ and $S^B$ emits light with an emission maximum between 500 nm to 560 nm,
   and wherein the relations expressed by the following formulas (1) to (4) apply:

$$T1^E > S1^S \tag{1}$$

$$T1^P > T1^S \tag{2}$$

$$T1^P > T1^E \tag{3}$$

$$T1^P > S1^E \tag{4}$$

2. The organic electroluminescent device according to claim 1, wherein the small FWHM emitter $S^B$ is characterized in that it has an emission spectrum, which exhibits a full width at half maximum (FWHM) of less than or equal to 0.25 eV.

3. The organic electroluminescent device according to claim 1, wherein the device exhibits an emission maximum $\lambda^{max}(D)$ of 500 nm to 560 nm.

4. The organic electroluminescent device according to claim 1, wherein the small FWHM emitter $S^B$ emits light with an emission maximum between 510 nm to 550 nm.

5. The organic electroluminescent device according to claim 1, wherein the device exhibits an emission maximum $\lambda^{max}(D)$ of 510 nm to 550 nm.

6. The organic electroluminescent device according to claim 1, wherein the light-emitting layer B additionally comprises
   (iv) a host material $H^N$, which has a lowermost excited singlet state energy level $S1^N$, a lowermost excited triplet state energy level $T1^N$, a highest occupied molecular orbital HOMO($H^N$) having an energy $E^{HOMO}(H^N)$ and a lowest unoccupied molecular orbital LUMO($H^N$) having an energy $E^{LUMO}(H^N)$;
   wherein the relations expressed by the following formulas (2N), (3N), and (4N) apply:

$$T1^N > T1^S \tag{2N}$$

$$T1^N > T1^E \tag{3N}$$

$$T1^N > S1^E \tag{4N},$$

and wherein the relations expressed by the following formulas (5) to (11) apply:

$$E^{LUMO}(H^P) > E^{LUMO}(S^B) \tag{5}$$

$$E^{LUMO}(H^P) > E^{LUMO}(E^B) \tag{6}$$

$$E^{HOMO}(H^P) < E^{HOMO}(E^B) \tag{7}$$

$$E^{LUMO}(H^N) < E^{LUMO}(S^B) \tag{8}$$

$$E^{HOMO}(H^N) < E^{HOMO}(S^B) \tag{9}$$

$$E^{LUMO}(H^N) < E^{LUMO}(E^B) \quad (10)$$

$$E^{HOMO}(H^N) < E^{HOMO}(E^B) \quad (11).$$

7. The organic electroluminescent device according to claim 1, wherein the small FWHM emitter $S^B$ is selected from the group consisting of a fluorescent emitter and a thermally activated delayed fluorescence (TADF) emitter.

8. The organic electroluminescent device according to claim 1, wherein the small FWHM emitter $S^B$ is a boron-based material.

9. The organic electroluminescent device according to claim 1, wherein the small FWHM emitter $S^B$ is characterized in that it has a $\Delta E_{ST}$ value, which corresponds to the energy difference between $S1^S$ and $T1^S$, of less than 0.4 eV.

10. The organic electroluminescent device according to claim 1, wherein the phosphorescence material $E^B$ comprises or consists of a structure of formula I,

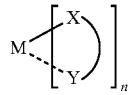

Formula I wherein
M is selected from the group consisting of Ir, Pt, Au, Eu, Ru, Re, Ag, and Cu;
n is an integer of 1 to 3,
X and Y are each independently a bidentate monoanionic ligand.

11. The organic electroluminescent device according to claim 1, wherein the light-emitting layer B comprises:
 (i) 22-70% by weight of the host compound $H^P$;
 (ii) 0-70% by weight of the host compound $H^N$;
 (iii) 5-10% by weight of the phosphorescence material $E^B$;
 (iv) 1-5% by weight of the emitter $S^B$; and optionally
 (v) 0-72% by weight of one or more solvents.

12. The organic electroluminescent device according to claim 1, wherein the light-emitting layer B comprises:
 (i) 10-30% by weight of the host compound $H^P$;
 (ii) 40-74% by weight of the host compound $H^N$;
 (iii) 15-30% by weight of the phosphorescence material $E^B$; and
 (iv) 1-5% by weight of the emitter $S^B$; and optionally
 (v) 0-34% by weight of one or more solvents.

13. A method for generating green light at a wavelength of from 500 to 560 nm, comprising the steps of:
 (i) providing an organic electroluminescent device according to claim 1; and
 (ii) applying an electrical current to said organic electroluminescent device.

* * * * *